(12) United States Patent
Hori et al.

(10) Patent No.: US 12,438,056 B2
(45) Date of Patent: Oct. 7, 2025

(54) SEMICONDUCTOR DEVICE AND METHOD FOR DETERMINING DETERIORATION OF SEMICONDUCTOR DEVICE

(71) Applicant: FUJI ELECTRIC CO., LTD., Kawasaki (JP)

(72) Inventors: Motohito Hori, Matsumoto (JP); Yoshinari Ikeda, Matsumoto (JP); Takaaki Tanaka, Hachioji (JP); Qichen Wang, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 414 days.

(21) Appl. No.: 18/181,171

(22) Filed: Mar. 9, 2023

(65) Prior Publication Data
US 2023/0369142 A1    Nov. 16, 2023

(30) Foreign Application Priority Data

May 12, 2022    (JP) .................................. 2022-078568

(51) Int. Cl.
*H01L 23/00*    (2006.01)
*G01R 31/28*    (2006.01)
(Continued)

(52) U.S. Cl.
CPC .......... *H01L 22/32* (2013.01); *G01R 31/2851* (2013.01); *H01L 23/049* (2013.01); *H01L 23/3735* (2013.01); *H01L 24/48* (2013.01); *H01L 25/072* (2013.01); *H01L 25/18* (2013.01); *H01L 2224/48139* (2013.01);
(Continued)

(58) Field of Classification Search
CPC ... H01L 22/32; H01L 23/049; H01L 23/3735; H01L 24/48; H01L 25/072; H01L 25/18; H01L 2224/48139; H01L 2924/12031; H01L 2924/12032; H01L 2924/13055; H01L 2924/13091; H01L 23/053; H01L 23/24; H01L 23/4006; H01L 23/5385; H01L 23/5386; H01L 24/49; H01L 22/14;
(Continued)

(56) References Cited

U.S. PATENT DOCUMENTS

2007/0296040 A1    12/2007  Tametani et al.
2021/0048472 A1    2/2021   Ito et al.

FOREIGN PATENT DOCUMENTS

JP    2007-113983 A    5/2007
JP    2008-004728 A    1/2008
(Continued)

*Primary Examiner* — Elias Ullah
(74) *Attorney, Agent, or Firm* — Rabin & Berdo, P.C.

(57) ABSTRACT

A semiconductor device includes a first input conductive plate on which a plurality of first semiconductor chips arranged in a first direction, a first output conductive plate extending in the first direction and being provided adjacent to the first input conductive plate, a case having first to fourth side walls for accommodating the first input conductive plate and the first output conductive plate, first main current wiring members, each of which connects one of the first output electrodes to a front surface of the first output conductive plate, a first detection terminal disposed in the first side wall, and a first detection wiring member connecting the front surface of the first output conductive plate to the first detection terminal. The first output conductive plate is disposed closer to the first side wall than is the first input conductive plate.

17 Claims, 14 Drawing Sheets

(51) Int. Cl.
  *H01L 21/66*   (2006.01)
  *H01L 23/049*  (2006.01)
  *H01L 23/373*  (2006.01)
  *H01L 25/07*   (2006.01)
  *H01L 25/18*   (2023.01)
(52) U.S. Cl.
  CPC .............. *H01L 2924/12031* (2013.01); *H01L 2924/12032* (2013.01); *H01L 2924/13055* (2013.01); *H01L 2924/13091* (2013.01)
(58) Field of Classification Search
  CPC .............. H01L 23/481; G01R 31/2851; G01R 31/2642; G01R 31/42; G01R 31/71
  See application file for complete search history.

(56) References Cited

FOREIGN PATENT DOCUMENTS

| | | |
|---|---|---|
| JP | 2011-200033 A | 10/2011 |
| WO | 2005/038919 A1 | 4/2005 |
| WO | 2019/146258 A1 | 8/2019 |
| WO | 2020/225897 A1 | 11/2020 |
| WO | 2021/176695 A1 | 9/2021 |

SEMICONDUCTOR DEVICE AND METHOD FOR DETERMINING DETERIORATION OF SEMICONDUCTOR DEVICE

CROSS-REFERENCE TO RELATED APPLICATION

This application is based upon and claims the benefit of priority of the prior Japanese Patent Application No. 2022-078568, filed on May 12, 2022, the entire contents of which are incorporated herein by reference.

BACKGROUND OF THE INVENTION

1. Field of the Invention

The embodiments discussed herein relate to a semiconductor device and a method for determining deterioration of the semiconductor device.

2. Background of the Related Art

A semiconductor device includes power devices and is used as a power conversion device. The power devices are, for example, insulated gate bipolar transistors (IGBTs) or power metal-oxide-semiconductor field-effect transistors (MOSFETs). In addition, the semiconductor device includes semiconductor chips including the power devices and includes a plurality of insulating circuit boards on which the semiconductor chips are disposed. These components are stored in a case including external connection terminals and control terminals connected to a positive electrode, a load, and a negative electrode. In addition, wires suitably connect the semiconductor chips, the insulating circuit boards, the external connection terminals, and the control terminals in the case.

For example, as the number of cycles increases in a power cycle test, solder bonding portions and wire bonding portions of the semiconductor device are deteriorated by thermal stress. Along with such deterioration, if the rated temperature of the semiconductor device is exceeded during an operation, the semiconductor device malfunctions. Thus, in one technique for preventing this malfunction, the semiconductor device is monitored by measuring or estimating the temperature of the semiconductor device. In a temperature estimation method, for example, the temperature of the semiconductor chips is estimated based on a voltage between main terminals of the semiconductor device. By estimating the temperature of the semiconductor device (the semiconductor chips) in this way, it is possible to determine deterioration of the semiconductor device.

In another method for determining deterioration of the semiconductor device, a life prediction wire is connected to wire bonding pads of a semiconductor chip, and deterioration of the semiconductor device is determined based on whether a current flows through the wire (for example, see Japanese Laid-open Patent Publication No. 2008-004728). In another technique, a reverse voltage is applied to a semiconductor chip when a voltage is applied to an electrode portion electrically connected to the semiconductor chip. In this technique, deterioration of the semiconductor device is determined based on a leakage current that flows through the semiconductor chip (for example, see International Publication Pamphlet No. 2020/225897). In a still another technique, a gate voltage applied to a semiconductor chip including an IGBT is changed, and deterioration is determined based on the collector-emitter voltage obtained at the time of this voltage change (for example, see Japanese Laid-open Patent Publication No. 2011-200033).

Even when deterioration of a semiconductor device is determined based on the potential difference between on-state main terminals, solder bonding portions and wire bonding portions are deteriorated by thermal stress as the number of cycles increases in a power cycle test as described above. The deterioration varies depending on the material and the thickness of the solder, the soldering temperature, the dimensions of the wires, and the bonding conditions of the wires. Thus, the above techniques have a problem in that it is difficult to accurately determine deterioration based on the potential difference between main terminals.

SUMMARY OF THE INVENTION

In one aspect of the embodiments, there is provided a semiconductor device including: a plurality of first semiconductor chips, each of which includes a first output electrode on a front surface thereof and a first input electrode on a rear surface thereof; a first input conductive plate on which the plurality of first semiconductor chips are arranged in a first direction and to which the first input electrodes of the plurality of first semiconductor chips are bonded; a first output conductive plate extending in the first direction and being provided adjacent to the first input conductive plate in a second direction orthogonal to the first direction; a case having first to fourth side walls, the first and third side walls each extending in the first direction, the second and fourth side walls each extending in the second direction, the case accommodating the first input conductive plate and the first output conductive plate; first main current wiring members, each of which connects one of the first output electrodes of the plurality of first semiconductor chips to a front surface of the first output conductive plate; a first detection terminal disposed in the first side wall, the first output conductive plate being disposed closer to the first side wall than is the first input conductive plate; and a first detection wiring member which connects the front surface of the first output conductive plate to the first detection terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 1 in FIGS. 1 and 2, terms "front surface" and "top surface" each express a surface facing in the +Z direction. Likewise, regarding the semiconductor device 1 in FIGS. 1 and 2, a term "up" expresses the +Z direction. Regarding the semiconductor device 1 in FIGS. 1 and 2, terms "rear surface" and "bottom surface" each express a surface facing in the −Z direction. Likewise, regarding the semiconductor device 1 in FIGS. 1 and 2, a term "down" expresses the −Z direction. Regarding the semiconductor device 1 in FIGS. 1 and 2, a term "side surface" expresses a surface connecting a "front surface" or a "top surface" and a "rear surface" or a "bottom surface". For example, regarding the semiconductor device 1 in FIGS. 1 and 2, a term "side surface" expresses a surface facing in the +X directions or the ±Y directions. In all the drawings, the above terms mean their respective directions. The terms "front surface", "top surface", "up", "rear surface", "bottom surface", "down", and "side surface" are simply used as convenient expressions to determine relative positional relationships and are not intended to limit the technical ideas of the embodiments. For example, the terms "up" and "down" may mean directions other than the vertical directions with respect to the ground. That is, the directions expressed by "up" and "down" are not limited to the directions relating to the gravitational force. In addition, in the following description, when a component contained in material represents 80 vol % or more of the material, this component will be referred to as the "main component" of the material. In addition, an expression "approximately the same" may be used when an error between two elements is within in +10%. In addition, even when two elements are not exactly perpendicular to each other, the two elements may be described as being "perpendicular" to each other if the error is within +10°. Similarly, even when two elements are not exactly parallel to each other, the two elements may be described as being "parallel" to each other if the error is within +10°.

First Embodiment

Figure 1:
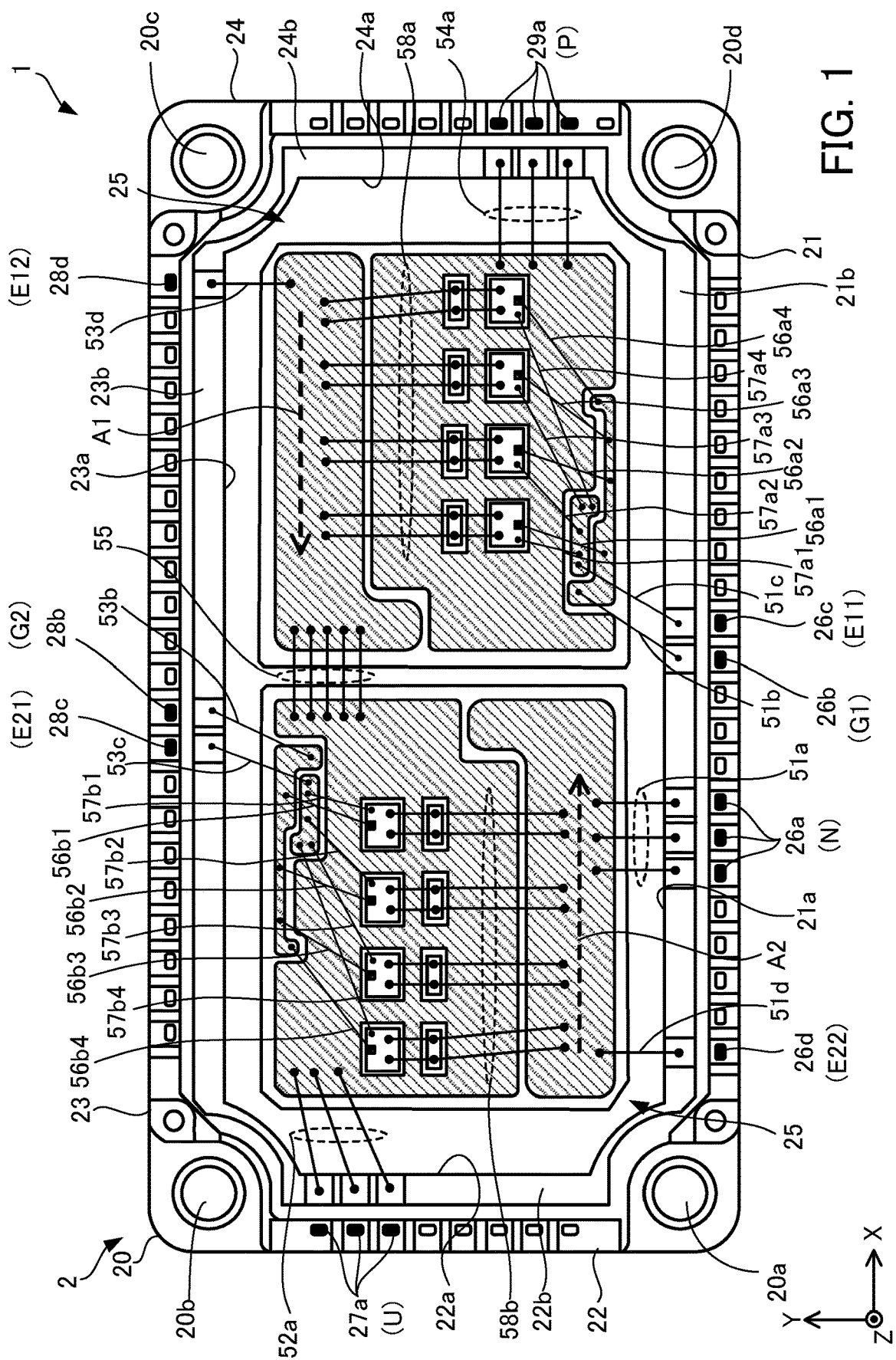
FIG. 1 is a plan view of a semiconductor device according to a first embodiment.
Figure 2:
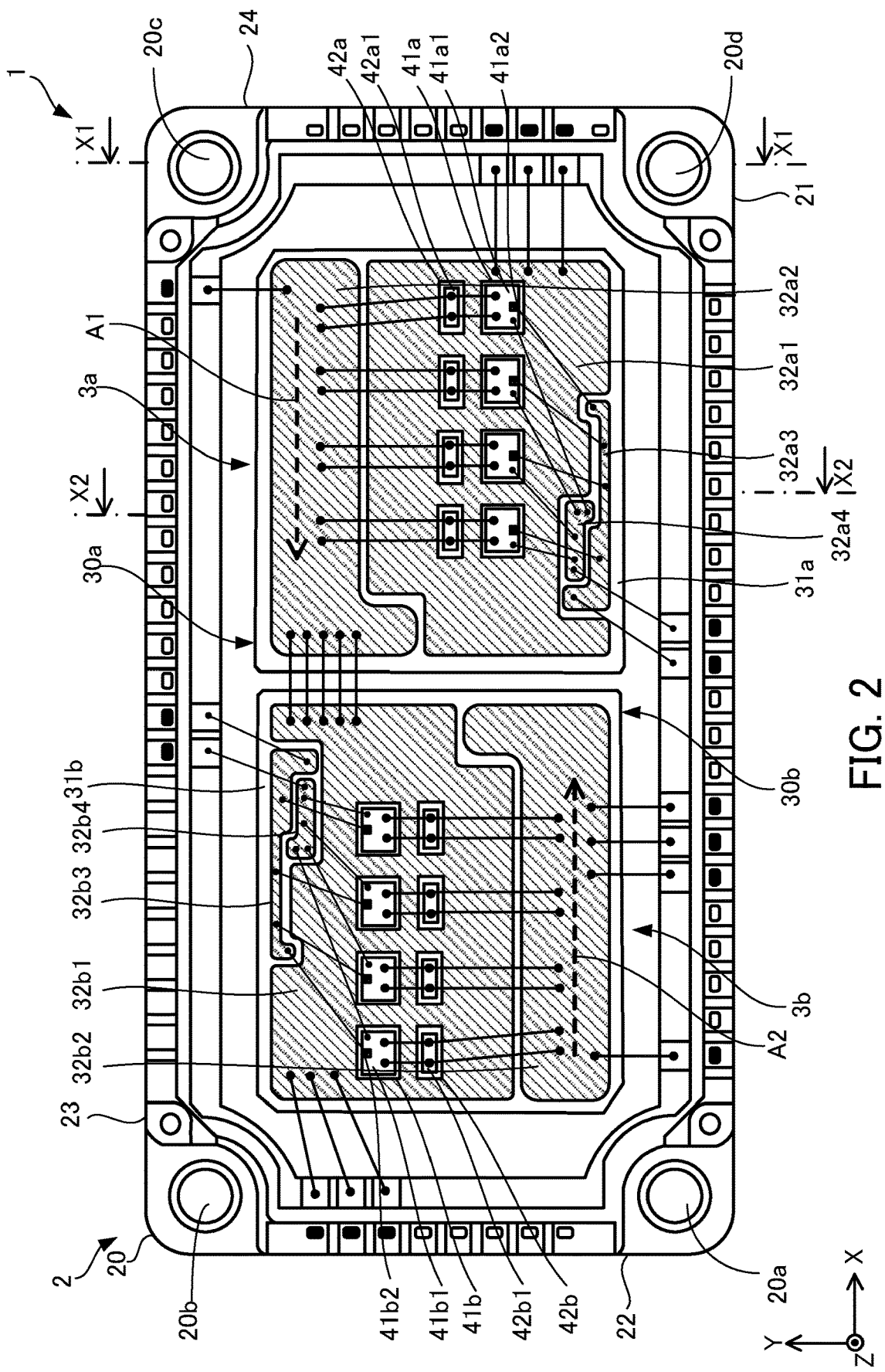
FIG. 2 is another plan view of the semiconductor device according to the first embodiment.
Figure 3:
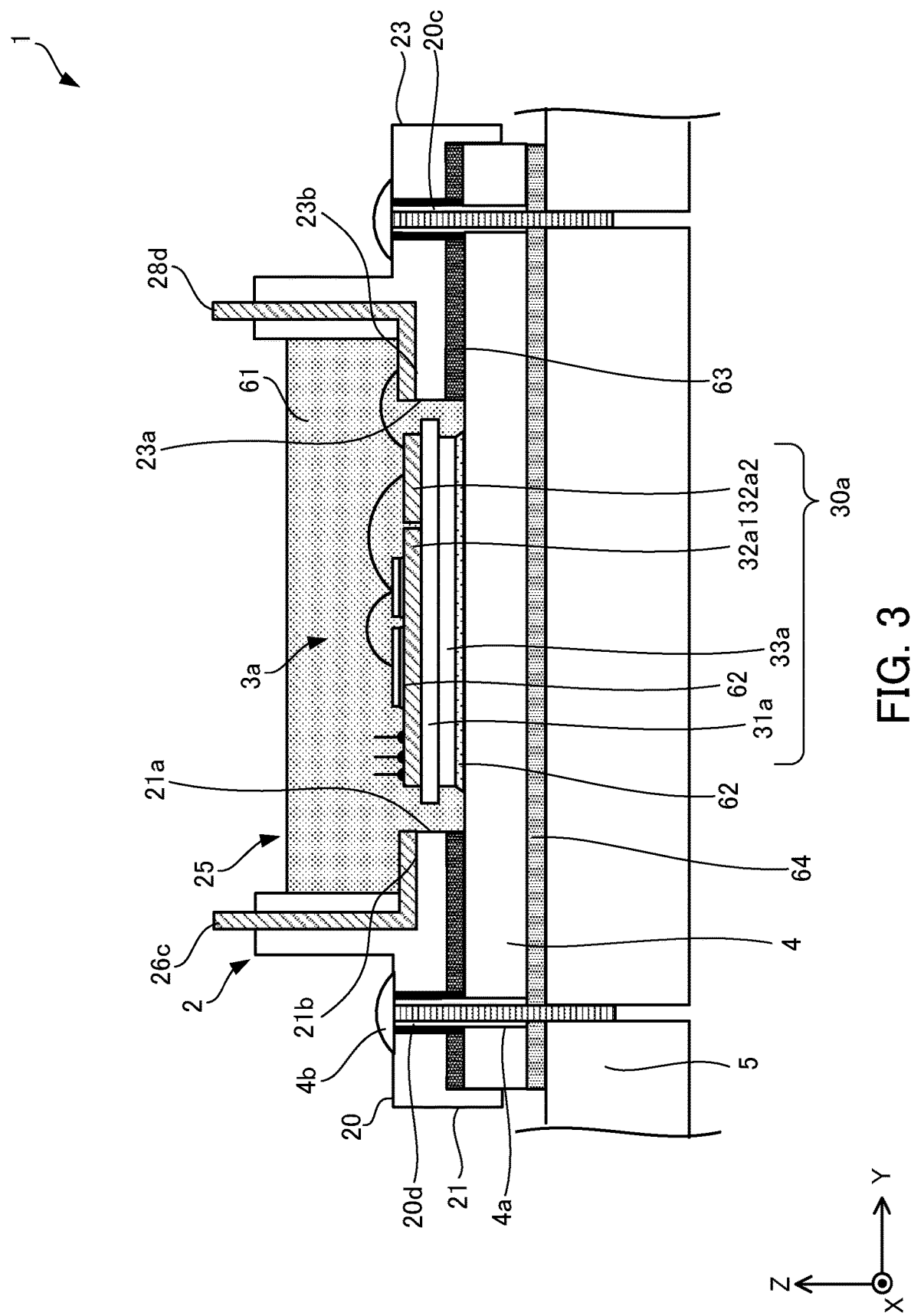
FIG. 3 is a sectional view of the semiconductor device according to the first embodiment.

A semiconductor device according to a first embodiment will be described with reference to FIGS. 1 to 3. FIGS. 1 and 2 are each a plan view of the semiconductor device according to the first embodiment. FIG. 3 is a sectional view of the semiconductor device according to the first embodiment. While FIGS. 1 and 2 illustrate the same semiconductor device 1, different reference characters are indicated in FIGS. 1 and 2. In FIGS. 1 and 2, illustration of sealing material 61 is omitted. In addition, FIG. 3 illustrates a case in which the semiconductor device 1 in FIG. 1 is fastened to a cooling unit 5. FIG. 3 is a sectional view of the semiconductor device 1, taken along a dashed-dotted line X1-X1 in FIG. 2.

The semiconductor device 1 includes semiconductor units 3a and 3b, a heat dissipation base board 4 on which the semiconductor units 3a and 3b are disposed, and a case 2 which is mounted on the heat dissipation base board 4 and which stores the semiconductor units 3a and 3b. The semiconductor units 3a and 3b stored in the case 2 are sealed by the sealing material 61.

The case 2 includes a frame 20 having a storage area 25 in its center and includes various kinds of terminals such as input, output, and control terminals, which are integrally included in the frame 20. The frame 20 has a rectangular shape in a plan view. The frame 20 includes a long side wall (third side wall) 21, a short side wall (fourth side wall) 22, a long side wall (first side wall) 23, and a short side wall (second side wall) 24, which surround four sides of the storage area 25 sequentially. The long side walls 21, 23 are parallel to each other, i.e., each extend in the same direction (first direction), and the short side walls 22, 24 are parallel to each other, i.e., each extend in the same direction (second direction orthogonal to the first direction). In addition, fastening holes 20a to 20d are sequentially formed in four corners of the frame 20. As long as the linear long side wall 21, short side wall 22, long side wall 23, and short side wall 24 are formed as rectangular four sides of the frame 20, the frame 20 may have a curved line (curved surface) portion at its corner portion. The long side wall 21, the short side wall 22, the long side wall 23, and the short side wall 24 are continuously connected to each other. The fastening holes 20a to 20d are open in the +Z directions.

The long side wall 21 includes main terminals 26a, a control terminal 26b, and emitter terminals 26c and 26d. The long side wall 21 is parallel to the X-Z plane and corresponds to a long side of the frame 20. A step portion 21b is formed on the inner side of the long side wall 21 (in the storage area 25). The step portion 21b protrudes into the storage area 25 from the inner bottom portion of the long side wall 21. The step portion 21b is formed to extend from one inner end of the long side wall 21 (the end near the short side wall 24) to the other inner end of the long side wall 21 (the end near the short side wall 22) (in the +X directions). The front surface of the step portion 21b is parallel to the X-Y plane and forms an approximately right angle with the long side wall 21. An inner wall surface 21a of the step portion 21b is parallel to the X-Z plane, faces the storage area 25, and is approximately flat and smooth.

The main terminals 26a are each a low potential terminal (a negative electrode: a connection point N). Each of the main terminals 26a has a columnar shape and is formed in the shape of the letter "L". Each main terminal 26a may have a flat plate shape and may be formed in the shape of the letter "L" by bending the flat plate shape at 90 degrees. One end of each main terminal 26a extends from the front surface of the long side wall 21 in the +Z direction. The other end of each main terminal 26a is exposed to the outside on the front surface of the step portion 21b. Each main terminal 26a is also formed in the long side wall 21, as is the case with the emitter terminal 26c illustrated in FIG. 3, for example. Although three main terminals 26a are formed in the present embodiment, the number of main terminals 26a is not limited to any particular number. These main terminals 26a are included in the long side wall 21 so as to face a +X direction end portion of a wiring plate 32b2 of the semiconductor unit 3b. That is, the individual main terminal 26a is included in the long side wall 21 so as to face a semiconductor chip 41b at a +X direction end portion of the semiconductor unit 3b.

The control terminal 26b (a connection point G1) has a columnar shape and is formed in the shape of the letter "L". One end of the control terminal 26b extends from the front surface of the long side wall 21 in the +Z direction. The other end of the control terminal 26b is exposed to the outside on the front surface of the step portion 21b. The control terminal 26b is also included in the long side wall 21, as is the case with the emitter terminal 26c illustrated in FIG. 3, for example. In the present embodiment, one control terminal 26b is formed. The control terminal 26b is included in the long side wall 21 so as to face a-X direction end portion of a wiring plate 32a1 of the semiconductor unit 3a.

The emitter terminals 26c and 26d are second and third detection terminals (connection points E11 and E22). The emitter terminals 26c and 26d each have a columnar shape and are each formed in the shape of the letter "L". Each of the emitter terminals 26c and 26d may have a flat plate shape and may be formed in the shape of the letter "L" by bending the flat plate shape at 90 degrees. One end of each of the emitter terminals 26c and 26d extends from the front surface of the long side wall 21 in the +Z direction. The other end of each of the emitter terminals 26c and 26d is exposed to the outside on the front surface of the step portion 21b. The emitter terminal 26d is also included in the long side wall 21, as is the case with the emitter terminal 26c illustrated in FIG. 3, for example. In the present embodiment, one emitter terminal 26c and one emitter terminal 26d are formed. The emitter terminal 26c is included in the long side wall 21 so as to face a-X direction end of the wiring plate 32a1 of the semiconductor unit 3a. The emitter terminal 26c neighbors the control terminal 26b in the +X direction. The emitter terminal 26d is included in the long side wall 21 so as to face a-X direction end of the wiring plate 32b2 of the semiconductor unit 3b. That is, the emitter terminal 26d is included in the long side wall 21 so as to face a semiconductor chip 41b at a −X direction end of the semiconductor unit 3b.

The short side wall 22 includes main terminals 27a. The short side wall 22 is parallel to the Y-Z plane and corresponds to a short side of the frame 20. A step portion 22b is formed on the inner side of the short side wall 22 (in the storage area 25). The step portion 22b protrudes into the storage area 25 from the inner bottom portion of the short side wall 22. The step portion 22b is formed to extend from one inner end of the short side wall 22 to the other inner end of the short side wall 22 (in the +Y directions). The front surface of the step portion 22b is parallel to the X-Y plane and forms an approximately right angle with the short side wall 22. An inner wall surface 22a of the step portion 22b is parallel to the Y-Z plane, faces the storage area 25, and is approximately flat and smooth.

The main terminals 27a are each an intermediate potential terminal (a load: a connection point U). Each of the main terminals 27a has a columnar shape and is formed in the shape of the letter "L". Each main terminal 27a may have a flat plate shape and may be formed in the shape of the letter "L" by bending the flat plate shape at 90 degrees. One end of each main terminal 27a extends from the front surface of the short side wall 22 in the +Z direction. The other end of each main terminal 27a is exposed to the outside on the front surface of the step portion 22b. Each main terminal 27a is also included in the short side wall 22, as is the case with the emitter terminal 26c illustrated in FIG. 3, for example. Although three main terminals 27a are formed in the present embodiment, the number of main terminals 26a is not limited to any particular number. These main terminals 27a are included in the short side wall 22 near the long side wall 23.

The long side wall 23 includes a control terminal 28b and emitter terminals 28c and 28d. The long side wall 23 is parallel to the X-Z plane and corresponds to a long side of the frame 20. A step portion 23b is formed on the inner side of the long side wall 23 (in the storage area 25). The step portion 23b protrudes into the storage area 25 from the inner bottom portion of the long side wall 23. The step portion 23b is formed to extend from one inner end of the long side wall 23 to the other inner end of the long side wall 23 (in the +X directions). The front surface of the step portion 23b is parallel to the X-Y plane and forms an approximately right angle with the long side wall 23. An inner wall surface 23a of the step portion 23b is parallel to the X-Z plane, faces the storage area 25, and is approximately flat and smooth.

The control terminal 28b has a columnar shape and is formed in the shape of the letter "L". One end of the control terminal 28b extends from the front surface of the long side wall 23 in the +Z direction. The other end of the control terminal 28b is exposed to the outside on the front surface of the step portion 23b. The control terminal 28b is also included in the long side wall 23, as is the case with the emitter terminal 26c illustrated in FIG. 3, for example. In the present embodiment, one control terminal 28b is formed. The control terminal 28b is included in the long side wall 23 so as to face a +X direction end of a wiring plate 32b1 of the semiconductor unit 3b.

The emitter terminals 28c and 28d are fourth and first detection terminals. Each of the emitter terminals 28c and 28d has a columnar shape and is formed in the shape of the letter "L". Each of the emitter terminals 28c and 28d may have a flat plate shape and may be formed in the shape of the letter "L" by bending the flat plate shape at 90 degrees. As is the case with the control terminal 28b, one end of each of the emitter terminals 28c and 28d extends from the front surface of the long side wall 23 in the +Z direction. As is the case with the control terminal 28b, the other end of each of the emitter terminals 28c and 28d is exposed to the outside on the front surface of the step portion 23b. The emitter terminals 28c and 28d are also included in the long side wall 23, as is the case with the emitter terminal 26c illustrated in FIG. 3, for example. In the present embodiment, one emitter terminal 28c and one emitter terminal 28d are formed. The emitter terminal 28c is included in the long side wall 23 so as to face a +X direction end of the wiring plate 32b1 of the semiconductor unit 3b. The emitter terminal 28c neighbors the control terminal 28b in the −X direction. The emitter terminal 28d is included in the long side wall 23 so as to face a +X direction end of the wiring plate 32a2 of the semiconductor unit 3a. That is, the emitter terminal 28d is included in the long side wall 23 so as to face a semiconductor chip 41a at the +X direction end of the semiconductor unit 3a.

The short side wall 24 includes main terminals 29a. The short side wall 24 is parallel to the Y-Z plane and corresponds to a short side of the frame 20. A step portion 24b is formed on the inner side of the short side wall 24 (in the storage area 25). The step portion 24b protrudes into the storage area 25 from the inner bottom portion of the short side wall 24. The step portion 24b is formed to extend from one inner end of the short side wall 24 to the other inner end of the short side wall 24 (in the +Y directions). The front surface of the step portion 24b is parallel to the X-Y plane and forms an approximately right angle with the short side wall 24. An inner wall surface 24a of the step portion 24b is parallel to the Y-Z plane, faces the storage area 25, and is approximately flat and smooth.

The main terminals 29a are each a high potential terminal (a positive electrode: a connection point P). Each of the main terminals 29a has a columnar chape and is formed in the shape of the letter "L". Each main terminal 29a may have a flat plate shape and may be formed in the shape of the letter "L" by bending the flat plate shape at 90 degrees. As is the case with the main terminals 26a, one end of each main terminal 29a extends from the front surface of the short side wall 24 in the +Z direction. As is the case with the main terminals 26a, the other end of each main terminal 29a is exposed to the outside on the front surface of the step portion 24b. The main terminals 29a are also included in the short side wall 24, as is the case with the emitter terminal 26c illustrated in FIG. 3, for example. Although three main terminals 29a are formed in the present embodiment, the number of main terminals 29a is not limited to any particular number. The main terminals 29a are included in the short side wall 24 near the long side wall 21.

In the case of the frame 20, the step portions 21b to 24b are continuously and integrally formed in a circular pattern on the inner side of the long side wall 21, the short side wall 22, the long side wall 23, and the short side wall 24. Thus, the area of the upper portion (in the +Z direction) of the storage area 25 of the frame 20 in a plan view is larger than the area of the lower portion (in the −Z direction) surrounded by the inner wall surfaces 21a to 24a in a plan view. In addition, the height of each of the inner wall surfaces 21a to 24a of the step portions 21b to 24b in the +Z direction may be the same as or greater than the height of each of the semiconductor units 3a and 3b.

The case 2 as described above includes various kinds of terminals and is formed by integral molding using resin. The resin contains thermoplastic resin as its main component. Examples of the thermoplastic resin include polyphenylene sulfide resin, polybutylene terephthalate resin, polybutylene succinate resin, polyamide resin, and acrylonitrile butadiene styrene resin.

The semiconductor units 3a and 3b are symmetric with respect to the center point of the storage area 25 in a plan view. The semiconductor unit 3a includes an insulating circuit board 30a and semiconductor chips 41a and 42a. The semiconductor unit 3b includes an insulating circuit board 30b and semiconductor chips 41b and 42b. Each of the insulating circuit boards 30a and 30b has a rectangular shape in a plan view. The insulating circuit boards 30a and 30b are formed side by side along the long side walls 21 and 23 in a plan view in the storage area 25. The insulating circuit board 30a includes an insulating plate 31a and wiring plates 32a1 to 32a4 formed on the front surface of the insulating plate 31a. The insulating circuit board 30b includes an insulating plate 31b and wiring plates 32b1 to 32b4 formed on the front surface of the insulating plate 31b. Each of the insulating circuit boards 30a and 30b further includes a metal plate 33a formed on the rear surface of the corresponding one of the insulating plates 31a and 31b. While the metal plate formed on the rear surface of the insulating plate 31b is not illustrated, the metal plate has the same size as that of the metal plate 33a and is made of the same material as that of the metal plate 33a.

The insulating plates 31a and 31b and the metal plates 33a (and the metal plate on the rear surface of the insulating plate 31b) each have a rectangular shape in a plan view. In addition, corner portions of the insulating plates 31a and 31b and the metal plate 33a formed on the rear surface of the insulating plate 31a may be rounded or chamfered. The metal plate 33a is smaller in size (outer shape) than either one of the insulating plates 31a and 31b and is formed on the inner side of the corresponding one of the insulating plates 31a and 31b.

The insulating 31a and 31b each have insulating properties and are each made of material having low thermal resistance and excellent thermal conductivity as its main component. Examples of the material include ceramic material and insulating resin. The ceramic material contains, for example, aluminum oxide, aluminum nitride, or silicon nitride as its main component. The insulating resin is, for example, a paper phenol board, a paper epoxy board, a glass composite board, or a glass epoxy board. The thickness of each of the insulating plates 31a and 31b is between 0.2 mm and 2.5 mm, inclusive.

The metal plate 33a (and the metal plate on the rear surface of the insulating plate 31b) is made of metal material having excellent thermal conductivity as its main component. The metal material is, for example, copper, aluminum, or an alloy containing at least one of these kinds. In addition, the thickness of the metal plate 33a (and the metal plate on the rear surface of the insulating plate 31b) is between 0.1 mm and 5.0 mm, inclusive. The surface of the metal plate 33a (and the metal plate on the rear surface of the insulating plate 31b) may be plated to improve its corrosion resistance. The material used for this plating is, for example, nickel, a nickel-phosphorus alloy, or a nickel-boron alloy.

The wiring plates 32a1 to 32a4 and 32b1 to 32b4 are each made of metal material having excellent electrical conductivity as its main component. Examples of the metal material include copper, aluminum, and an alloy containing at least one of these kinds. The thickness of each of the wiring plates 32a1 to 32a4 and 32b1 to 32b4 is between 0.1 mm and 5.0 mm, inclusive. The surface of each of the wiring plates 32a1 to 32a4 and 32b1 to 32b4 may be plated to improve its corrosion resistance. The material used for this plating is, for example, nickel, a nickel-phosphorus alloy, or a nickel-boron alloy. The wiring plates 32a1 to 32a4 and 32b1 to 32b4 are obtained by forming a metal layer on the front surface of each of the insulating plates 31a and 31b and performing etching or the like on this metal layer. Alternatively, the wiring plates 32a1 to 32a4 and 32b1 to 32b4 may first be cut out from a metal layer and may next be fixed to the front surfaces of the insulating plates 31a and 31b by applying pressure.

The wiring plate 32a1 is a first input conductive plate and extends between a +X direction end portion and a −X direction end portion of the insulating plate 31a near the long side wall 21. The wiring plate 32a1 has a concave portion near the long side wall 21. A cutout is formed at a corner portion of the wiring plate 32a1, the corner portion being located in the direction of the long side wall 23 and the short side wall 22.

The wiring plate 32b1 is a second input conductive plate and extends between a +X direction end portion and a −X direction end portion of the insulating plate 31b near the long side wall 23. The wiring plate 32b1 has a concave portion near the long side wall 23. A cutout is formed at a corner portion of the wiring plate 32b1, the corner portion being located in the direction of the long side wall 21 and the short side wall 24.

The wiring plate 32a2 is a first output conductive plate and extends between a +X direction end portion and a −X direction end portion of the insulating plate 31a near the long side wall 23. That is, the wiring plate 32a2 extends in the direction from the short side wall 24 to the short side wall 22 (along an arrow A1 (a first direction)). The arrow A1 is parallel to the long side walls 21 and 23. The wiring plate 32a2 is formed in the shape of the letter "L" in a plan view and includes a protruding area that protrudes in the direction of the long side wall 21. The protruding area of the wiring plate 32a2 protrudes into the cutout of the wiring plate 32a1.

The wiring plate 32b2 is a second output conductive plate and extends between a +X direction end portion and a −X direction end portion of the insulating plate 31b near the long side wall 21. That is, the wiring plate 32b2 extends in the direction from the short side wall 22 to the short side wall 24 (along an arrow A2 (a second direction)). The arrow A2 is parallel to the long side walls 21 and 23. The wiring plate 32b2 is formed in the shape of the letter "L" in a plan view and includes a protruding area that protrudes in the direction of the long side wall 23. The protruding area of the wiring plate 32b2 protrudes into the cutout of the wiring plate 32b1.

The wiring plate 32a3 is formed in the concave portion of the wiring plate 32a1 along the long side wall 21. The wiring plate 32b3 is formed in the concave portion of the wiring plate 32b1 along the long side wall 23. The wiring plate 32a4 is formed between the wiring plates 32a1 and 32a3 along the long side wall 21 in the concave portion of the wiring plate 32a1. The wiring plate 32b4 is formed between the wiring plates 32b1 and 32b3 along the long side wall 23 in the concave portion of the wiring plate 32b1.

For example, a direct copper bonding (DCB) board or an active metal brazed (AMB) board may be used as each of the insulating circuit boards 30a and 30b having the above-described structure and including the insulating plates 31a and 31b made of ceramic material. The insulating circuit boards 30a and 30b transfer the heat generated by the semiconductor chips 41a and 42a and the semiconductor chips 41b and 42b to the outside via the wiring plates 32a1 and 32b1, the insulating plates 31a and 31b, and the metal plate 33a (and the metal plate on the rear surface of the insulating plate 31b).

The semiconductor chips 41a and 42a are bonded to the wiring plate 32a1 along the arrow A1. The semiconductor chips 41b and 42b are bonded to the wiring plate 32b1 along the arrow A2. The semiconductor chips 41a and 41b and the semiconductor chips 42a and 42b may each be made of silicon or silicon carbide as its main component. The semiconductor chips 41a and 41b include switching elements. In this case, each of the semiconductor chips 41a includes an output electrode 41a1 and a control electrode 41a2 on its front surface, and each of the semiconductor chips 41b includes an output electrode 41b1 and a control electrode 41b2 on its front surface. The semiconductor chips 41a and 41b include input electrodes on their rear surface. The switching elements are, for example, power MOSFETs or IGBTs. When power MOSFETs are used as the switching elements, the semiconductor chips 41a and 41b each include an input electrode (a drain electrode) as a main electrode on its rear surface and include a gate electrode as the corresponding one of the control electrodes 41a2 and 41b2 and the corresponding one of the output electrodes 41a1 and 41b1 (a source electrode) as a main electrode on its front surface. When IGBTs are used as the switching elements, the semiconductor chips 41a and 41b each include an input electrode (a collector electrode) as a main electrode on its rear surface and include a gate electrode as a control electrode 41a2 or 41b2 and an output electrode 41a1 or 41b1 (an emitter electrode) as a main electrode on its front surface. The following description will be made based on an example in which the semiconductor chips 41a and 41b are IGBTs. Alternatively, the semiconductor chips 41a and 41b may include reverse-conducting (RC)-IGBTs. An RC-IGBT has the function of an IGBT and the function of a free-wheeling diode (FWD). In this case, the semiconductor chips 42a and 42b are removed.

The semiconductor chips 42a and 42b each include a diode element. The diode element is, for example, an FWD such as a Schottky barrier diode (SBD) or a P-intrinsic-N (PiN) diode. These semiconductor chips 42a and 42b each include a cathode electrode as a main electrode on its rear surface and include an anode electrode as a main electrode on its front surface.

Solder or sintered material is used as bonding material 62 for bonding the semiconductor chips 41a and 41b and the semiconductor chips 42a and 42b to the wiring plates 32a1 and 32b1. Lead-free solder is used as the solder. Lead-free solder contains at least one of a tin-silver-copper alloy, a tin-zinc-bismuth alloy, a tin-copper alloy, and a tin-silver-indium-bismuth alloy as its main component, for example. The solder may also contain additive. Metal sintered material may be used as the sintered material. The metal sintered material contains silver or a silver alloy as its main component.

The semiconductor units 3a and 3b having the above-described structure are stored in the case 2 and are suitably wired by wiring members. The wiring members are, for example, wires. The wires include main current wires 51a, 52a, and 54a, control wires 51b and 53b, sense wires 51c and 53c, detection wires 51d and 53d, and connection wires 55. The wiring members also include wires 56a1 to 56a4 and 56b1 to 56b4, wires 57a1 to 57a4 and 57b1 to 57b4, and wiring wires 58a and 58b.

These wires are each made of material having excellent electrical conductivity as its main component. Examples of the material include gold, silver, copper, aluminum, and an alloy containing at least one of these kinds. In addition, the diameter of each of the main current wires 51a, 52a, and 54a, the connection wires 55, and the wiring wires 58a and 58b is, for example, between 350 μm and 500 μm, inclusive. The diameter of each of the control wires 51b and 53b, the sense wires 51c and 53c, the detection wires 51d and 53d, the wires 56a1 to 56a4 and 56b1 to 56b4, and the wires 57a1 to 57a4 and 57b1 to 57b4 is, for example, between 110 μm and 200 μm, inclusive. These wires are suitably bonded by bonding performed by a bonding apparatus.

The main current wires 51a mechanically and electrically connect the main terminals 26a and the wiring plate 32b2. Each main current wire 51a is connected to a portion of a main terminal 26a, the portion being exposed to the outside on the step portion 21b. Each main current wire 51a is connected to a portion of the wiring plate 32b2, the portion being located near the long side wall 21. Each main current wire 51a extends in the direction from the long side wall 21 to the long side wall 23. That is, the wiring direction of each main current wire 51a may be approximately parallel to the short side walls 22 and 24 (the +Y directions).

The main current wires 52a mechanically and electrically connect the main terminals 27a and the wiring plate 32b1. Each main current wire 52a is connected to a portion of a main terminal 27a, the portion being exposed to the outside on the step portion 22b. Each main current wire 52a is connected to a portion of the wiring plate 32b1, the portion being located near the short side wall 22. Each main current wire 52a extends in the direction from the short side wall 22 to the short side wall 24. The wiring direction of the main current wire 52a may be approximately parallel to the long side walls 21 and 23 (the +X directions).

The main current wires 54a mechanically and electrically connect the main terminals 29a and the wiring plate 32a1. Each main current wire 54a is connected to a portion of a main terminal 29a, the portion being exposed to the outside on the step portion 24b. Each main current wire 54a is connected to a portion of the wiring plate 32a1, the portion being located near the short side wall 24. Each main current wire 54a extends in the direction from the short side wall 24 to the short side wall 22. The wiring direction of the main current wire 54a may be approximately parallel to the long side walls 21 and 23 (the +X directions).

The control wire 51b mechanically and electrically connects the control terminal 26b and the wiring plate 32a3. The control wire 51b is connected to a portion of the control terminal 26b, the portion being exposed to the outside on the step portion 21b. The control wire 51b is connected to a portion of the wiring plate 32a3, the portion being located in the direction of the short side wall 22. The control wire 51b extends in the direction from the long side wall 21 to the long side wall 23.

The control wire 53b mechanically and electrically connects the control terminal 28b and the wiring plate 32b3. The control wire 53b is connected to a portion of the control terminal 28b, the portion being exposed to the outside on the step portion 23b. The control wire 53b is connected to a portion of the wiring plate 32b3, the portion being located in the direction of the short side wall 24. The control wire 53b extends in the direction from the long side wall 23 to the long side wall 21.

The sense wire 51c mechanically and electrically connects the emitter terminal 26c and the wiring plate 32a4. The sense wire 51c is connected to a portion of the emitter terminal 26c, the portion being exposed to the outside on the step portion 21b. The sense wire 51c is connected to a portion of the wiring plate 32a4, the portion being located in the direction of the short side wall 22. The sense wire 51c extends in the direction from the long side wall 21 to the long side wall 23.

The sense wire 53c mechanically and electrically connects the emitter terminal 28c and the wiring plate 32b4. The sense wire 53c is connected to a portion of the emitter terminal 28c, the portion being exposed to the outside on the step portion 23b. The sense wire 53c is connected to a portion of the wiring plate 32b4, the portion being located in the direction of the short side wall 24. The sense wire 53c extends in the direction from the long side wall 23 to the long side wall 21.

The detection wire 51d mechanically and electrically connects the emitter terminal 26d and the wiring plate 32b2. The detection wire 51d is connected to a portion of the emitter terminal 26d, the portion being exposed to the outside on the step portion 21b. The detection wire 51d is connected to a portion of the wiring plate 32b2, the portion being located near the long side wall 21 and the short side wall 22. The detection wire 51d extends in the direction from the long side wall 21 to the long side wall 23. The wiring direction of the detection wire 51d may be approximately parallel to the short side walls 22 and 24 (the +Y directions). That is, the wiring angle of the wiring direction of the detection wire 51d with respect to the direction of the arrow A2 is between 70° and 110°, inclusive, preferably between 85° and 95°, inclusive, and more preferably, 90°.

The detection wire 53d mechanically and electrically connects the emitter terminal 28d and the wiring plate 32a2. The detection wire 53d is connected to a portion of the emitter terminal 28d, the portion being exposed to the outside on the step portion 23b. The detection wire 53d is connected to a portion of the wiring plate 32a2, the portion being located near the long side wall 23 and the short side wall 24. The detection wire 53d extends in the direction from the long side wall 23 to the long side wall 21. The wiring direction of the detection wire 53d may be approximately parallel to the short side walls 22 and 24 (the +Y directions). That is, the wiring angle of the wiring direction of the detection wire 53d with respect to the direction of the arrow A1 is between 70° and 110°, inclusive, preferably between 85° and 95°, inclusive and, more preferably, 90°.

The connection wires 55 mechanically and electrically connect the wiring plate 32a2 of the semiconductor unit 3a and the wiring plate 32b1 of the semiconductor unit 3b. The connection wires 55 are connected to a portion of the wiring plate 32a2, the portion being located in the direction of the short side wall 22. The connection wires 55 are connected to a portion of the wiring plate 32b1, the portion being located in the direction of the short side wall 24. The connection wires 55 extend in the direction from the short side wall 22 to the short side wall 24. That is, the wiring direction of the connection wires 55 is approximately parallel to the long side walls 21 and 23 (+X directions).

The wires 56a1 to 56a4 mechanically and electrically connect the control electrodes 41a2 of the semiconductor chips 41a and the wiring plate 32a3. The wires 56a1 to 56a4 are connected to the wiring plate 32a3 at approximately equal intervals.

The wires 56b1 to 56b4 mechanically and electrically connect the control electrodes 41b2 of the semiconductor chips 41b and the wiring plate 32b3. The wires 56b1 to 56b4 are connected to the wiring plate 32b3 at approximately equal intervals.

The wires 57a1 to 57a4 mechanically and electrically connect the output electrodes 41a1 of the semiconductor chips 41a and the wiring plate 32a4. The wires 57a1 to 57a4 are connected to the wiring plate 32a4 at approximately equal intervals.

The wires 57b1 to 57b4 mechanically and electrically connect the output electrodes 41b1 of the semiconductor chips 41b and the wiring plate 32b4. The wires 57b1 to 57b4 are connected to the wiring plate 32b4 at approximately equal intervals.

The wiring wires 58a mechanically and electrically connect the output electrodes 41a1 of the semiconductor chips 41a, the input electrodes 42a1 of the semiconductor chips 42a, and the wiring plate 32a2. The wiring wires 58a are connected to a portion of the wiring plate 32a2, the portion being located in the direction of the long side wall 21 (the wiring plate 32a1). The wiring wires 58a extend in the direction from the long side wall 21 to the long side wall 23.

That is, the wiring direction of the wiring wires 58*a* may be approximately parallel to the short side walls 22 and 24 (the +Y directions).

The wiring wires 58*b* mechanically and electrically connect the output electrodes 41*b*1 of the semiconductor chips 41*b*, the input electrodes 42*b*1 of the semiconductor chips 42*b*, and the wiring plate 32*b*2. The wiring wires 58*b* are connected to a portion of the wiring plate 32*b*2, the portion being located in the direction of the long side wall 23 (the wiring plate 32*b*1). The wiring wires 58*b* extend in the direction from the long side wall 21 to the long side wall 23. That is, the wiring direction of the wiring wires 58*b* may be approximately parallel to the short side walls 22 and 24 (the +Y directions).

For example, the heat dissipation base board 4 is made of aluminum, iron, silver, copper, or an alloy containing at least one of these kinds having excellent thermal conductivity. In addition, the surface of the heat dissipation base board 4 may be plated to improve its corrosion resistance. The material used for this plating is, for example, nickel, a nickel-phosphorus alloy, or a nickel-boron alloy. This heat dissipation base board 4 has a rectangular shape in a plan view. The heat dissipation base board 4 has a substantially flat and smooth front surface. The semiconductor units 3*a* and 3*b* (the insulating circuit boards 30*a* and 30*b*) are bonded to the front surface of the heat dissipation base board 4 via the bonding material 62. The bonding material 62 is, for example, solder as described above. The case 2 is bonded to an outer periphery area of the heat dissipation base board 4, the outer periphery area being located outside the semiconductor units 3*a* and 3*b*, via adhesive material 63. In this way, the semiconductor units 3*a* and 3*b* are surrounded by the case 2 (see FIG. 3).

In addition, through-holes 4*a* (see FIG. 3) are formed in four corners of the heat dissipation base board 4. The inner diameter and the location of the through-holes 4*a* correspond to those of the fastening holes 20*a* to 20*d* in the case 2. As described above, when the case 2 is bonded to the heat dissipation base board 4, the through-holes 4*a* are located at their respective fastening holes 20*a* to 20*d* in the case 2.

The cooling unit 5 may be attached to the rear surface of the heat dissipation base board 4 via a thermally conductive member 64, so as to improve the heat dissipation properties of the semiconductor device 1. The cooling unit 5 may be attached to the heat dissipation base board 4 by fastening screws 4*b* into the fastening holes 20*a* to 20*d*. Alternatively, the cooling unit 5 may be bonded and attached to the heat dissipation base board 4 via, for example, solder or silver solder, without using the screws 4*b*. The cooling unit 5 in this case is made of aluminum, iron, silver, copper, or an alloy containing at least one of these kinds having excellent thermal conductivity, for example. In addition, the cooling unit 5 may be a heatsink including a plurality of fins or a water-cooled cooling device, for example. In addition, the heat dissipation base board 4 may be structured integrally with the cooling unit 5. In this case, the heat dissipation base board 4 is made of aluminum, iron, silver, copper, or an alloy containing at least one of these kinds having excellent thermal conductivity. This heat dissipation base board 4 may be plated to improve its corrosion resistance. The material used for this plating is, for example, nickel, a nickel-phosphorus alloy, or a nickel-boron alloy.

The thermally conductive member 64 is thermal interface material (TIM). TIM is a generic term for various kinds of material such as thermally conductive grease, thermal compound, an elastomer sheet, room temperature vulcanization (RTV) rubber, gel, and phase change material, solder, and silver solder.

The sealing material 61 contains thermosetting resin in which filler is mixed as its main component. The thermosetting resin is, for example, epoxy resin, phenol resin, maleimide resin, or polyester resin. The filler is an insulating ceramic material having high thermal conductivity. Examples of the filler include silicon oxide, aluminum oxide, boron nitride, and aluminum nitride.

Figure 4:
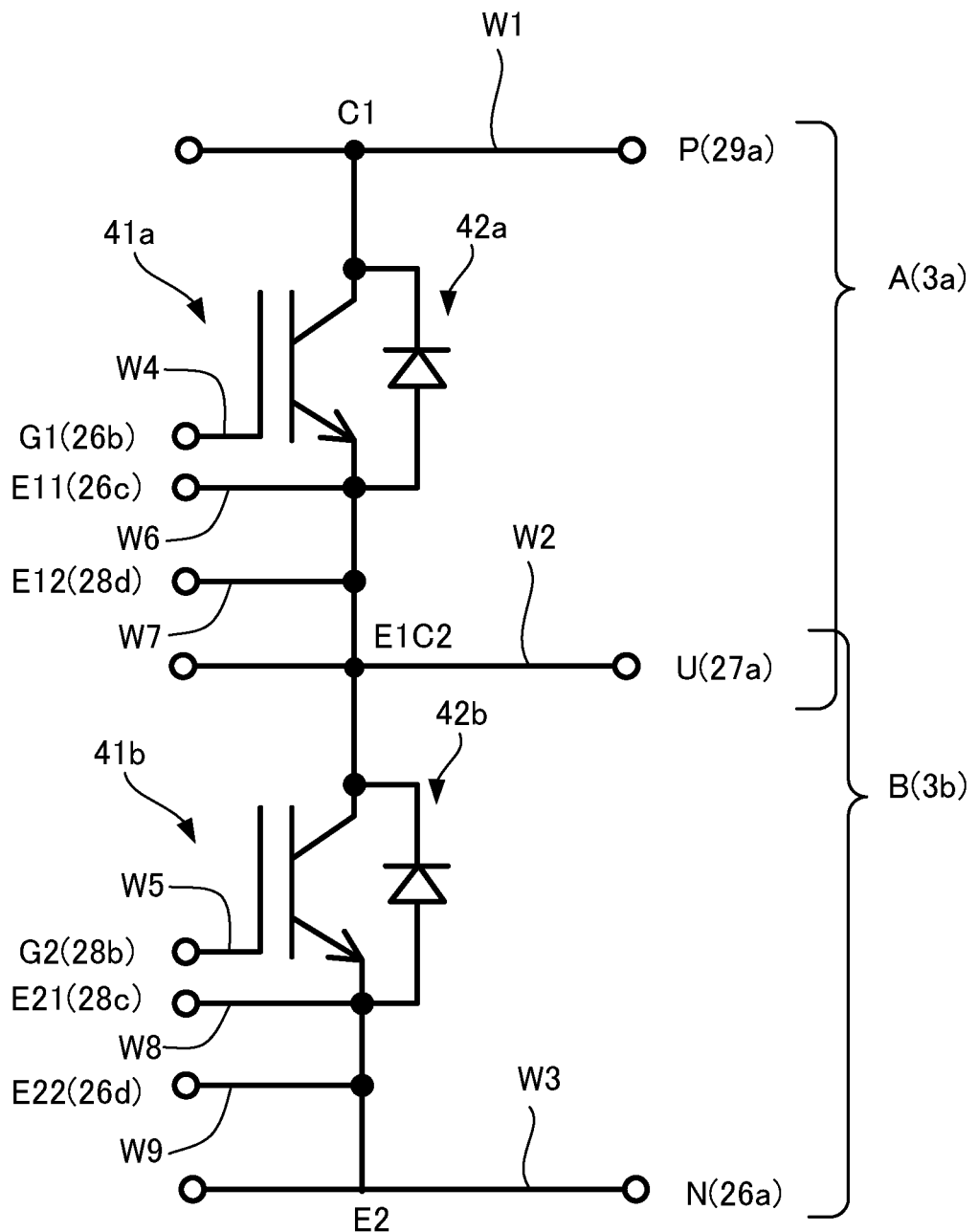
FIG. 4 is an equivalent circuit diagram illustrating a function of the semiconductor device according to the first embodiment.

Next, a circuit configuration included in the semiconductor device 1 as described above will be described with reference to FIG. 4. FIG. 4 is an equivalent circuit diagram illustrating a function of the semiconductor device according to the first embodiment. As illustrated in FIG. 4, the semiconductor device 1 constitutes a half-bridge circuit including an upper arm portion A and a lower arm portion B. The connection point P is connected to the positive electrode of an external power supply (not illustrated). The connection point P and a connection point C1 connected to the input electrode of the individual semiconductor chip 41*a* are connected by a wiring W1. The wiring W1 includes the individual main terminal 29*a*, the individual main current wire 54*a*, and the wiring plate 32*a*1.

The connection point U is connected to a load (not illustrated). The connection point U and a connection point E1C2 connected to the output electrode of the individual semiconductor chip 41*a* and the input electrode of the individual semiconductor chip 41*b* are connected by a wiring W2. The wiring W2 includes the individual wiring wire 58*a*, the wiring plate 32*a*2, the individual connection wire 55, the wiring plate 32*b*1, the individual main current wire 52*a*, and the individual main terminal 27*a*. In addition, the wiring W2 includes the wiring plate 32*b*1, the individual main current wire 52*a*, and the individual main terminal 27*a*.

The connection point N is connected to the negative electrode of the external power supply (not illustrated). The connection point N and a connection point E2 connected to the output electrode of the individual semiconductor chip 41*b* are connected by a wiring W3. The wiring W3 includes the individual wiring wire 58*b*, the wiring plate 32*b*2, the individual main current wire 51*a*, and the individual main terminal 26*a*.

The connection point G1 is connected to a control power supply (not illustrated). The connection point G1 and the control electrode of the individual semiconductor chip 41*a* are connected by a wiring W4. The wiring W4 includes the control terminal 26*b*, the control wire 51*b*, the wiring plate 32*a*1, and the individual wires 56*a*1 to 56*a*4.

A connection point G2 is connected to the control power supply (not illustrated). The connection point G2 and the control electrode of the individual semiconductor chip 41*b* are connected by a wiring W5. The wiring W5 includes the control terminal 28*b*, the control wire 53*b*, the wiring plate 32*b*1, and the individual wires 56*b*1 to 56*b*4.

An output current from the semiconductor chips 41*a* is outputted to a connection point E11. The connection point E11 and the output electrode 41*a*1 of the individual semiconductor chip 41*a* are connected by a wiring W6. The wiring W6 includes the emitter terminal 26*c*, the sense wire 51*c*, the wiring plate 32*a*4, and the individual wires 57*a*1 to 57*a*4.

An output current from the semiconductor chips 41*a* is outputted to a connection point E12. The connection point E12 and the output electrode 41*a*1 of the individual semiconductor chip 41*a* are connected by a wiring W7. The wiring W7 includes the emitter terminal 28d, the detection wire 53d, the wiring plate 32a2, and the individual wiring wire 58a.

An output current from the semiconductor chips 41b is outputted to a connection point E21. The connection point E21 and the output electrode 41b1 of the individual semiconductor chip 41b are connected by a wiring W8. The wiring W8 includes the emitter terminal 28c, the sense wire 53c, the wiring plate 32b4, and the individual wires 57b1 to 57b4.

An output current from the semiconductor chips 41b is outputted to a connection point E22. The connection point E22 and the output electrode 41b1 of the individual semiconductor chip 41b are connected by a wiring W9. The wiring W9 includes the emitter terminal 26d, the detection wire 51d, the wiring plate 32b2, and the individual wiring wires 58b.

The upper arm portion A of the semiconductor device 1 includes the semiconductor unit 3a, the main terminals 29a, the control terminal 26b, the emitter terminal 26c, the emitter terminal 28d, and the wiring members connecting the semiconductor unit 3a and the terminals described above. In addition, the upper arm portion A includes the connection wires 55, the wiring plate 32b1, the main current wires 52a, and the main terminals 27a. The lower arm portion B includes the semiconductor unit 3b, the main terminals 26a, the control terminal 28b, the emitter terminal 28c, the emitter terminal 26d, and the wiring members connecting the semiconductor unit 3b and the terminals described above. Because the wiring plate 32a2 and the wiring plate 32b1 are connected to each other by the connection wires 55, the upper arm portion A and the lower arm portion B are connected to each other. Thus, the semiconductor device 1 functions as a half-bridge circuit including the upper arm portion A and the lower arm portion B.

Figure 5A:
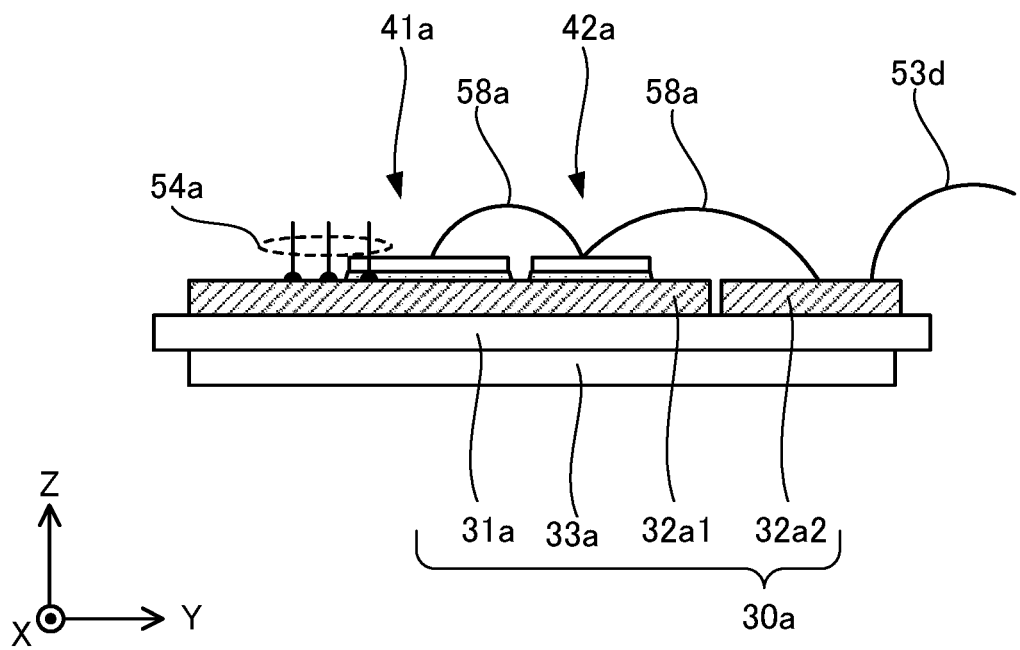
FIGS. 5A and 5B are each a sectional view of a semiconductor unit included in the semiconductor device according to the first embodiment.
Figure 5B:
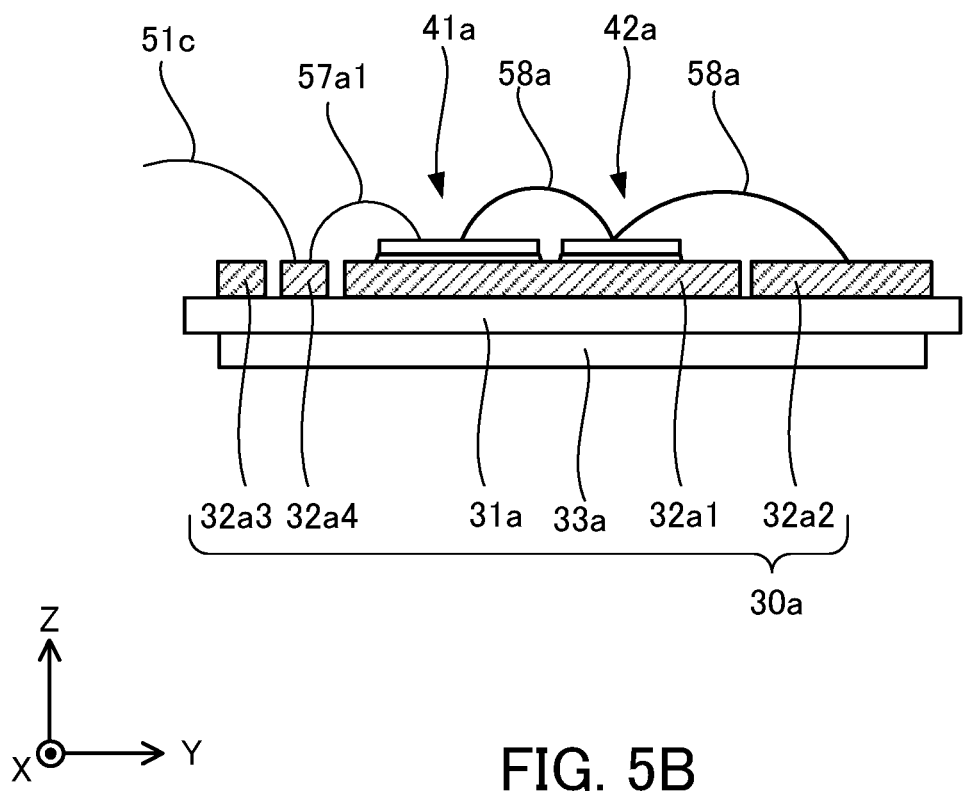

Next, an example of a current flow in the semiconductor device 1 will be described with reference to FIGS. 1 and 2 and FIGS. 5A and 5B. FIGS. 5A and 5B are each a sectional view of a semiconductor unit included in the semiconductor device according to the first embodiment. FIG. 5A is a sectional view of a semiconductor unit taken along the dashed-dotted line X1-X1 in FIG. 2. FIG. 5B is a sectional view of the semiconductor unit taken along a dashed-dotted line X2-X2 in FIG. 2.

In the case of the semiconductor unit 3a of the semiconductor device 1, the negative electrode (low potential) is connected to the main terminals 26a, the positive electrode (high potential) is connected to the main terminals 29a, and the load (intermediate potential) is connected to the main terminals 27a. In this case, as illustrated in FIG. 5A, when a control signal is inputted to the control terminal 26b, a current from the main terminals 29a is inputted to the input electrodes on the rear surfaces of the semiconductor chips 41a via the main current wires 54a and the wiring plate 32a1, and an output current is outputted from the output electrodes 41a1 on the front surfaces of the semiconductor chips 41a. The output current flows through the wiring plate 32a2 via the wiring wires 58a along the arrow A1 in the direction of the main terminals 27a. In addition, in this case, the output current flows through the wiring wires 58a, the wiring plate 32a2, and the detection wire 53d and is outputted from the emitter terminal 28d.

In addition, in this case, the output current outputted from the output electrodes 41a1 of the semiconductor chips 41a is outputted from the emitter terminal 26c via the wires 57a1 to 57a4 (the wire 57a1 is illustrated in FIG. 5B), the wiring plate 32a4, and the sense wire 51c, as illustrated in FIG. 5B.

In addition, in the case of the semiconductor unit 3b of the semiconductor device 1, too, when a control signal is inputted to the control terminal 28b, a current from the main terminals 27a is inputted to the input electrodes on the rear surface of the semiconductor chips 41b via the main current wires 52a and the wiring plate 32b1, and an output current is outputted from the output electrodes 41b1 on the front surfaces of the semiconductor chips 41b. The output current flows through the wiring plate 32b2 via the wiring wires 58b along the arrow A2 in the direction of the main terminals 26a. In addition, in this case, the output current flows through the wiring wires 58b, the wiring plate 32b2, and the detection wire 51d and is outputted from the emitter terminal 26d.

In addition, in this case, the output current outputted from the output electrodes 41b1 of the semiconductor chips 41b is outputted from the emitter terminal 28c via the wires 57b1 to 57b4, the wiring plate 32b4, and the sense wire 53c.

Figure 6:
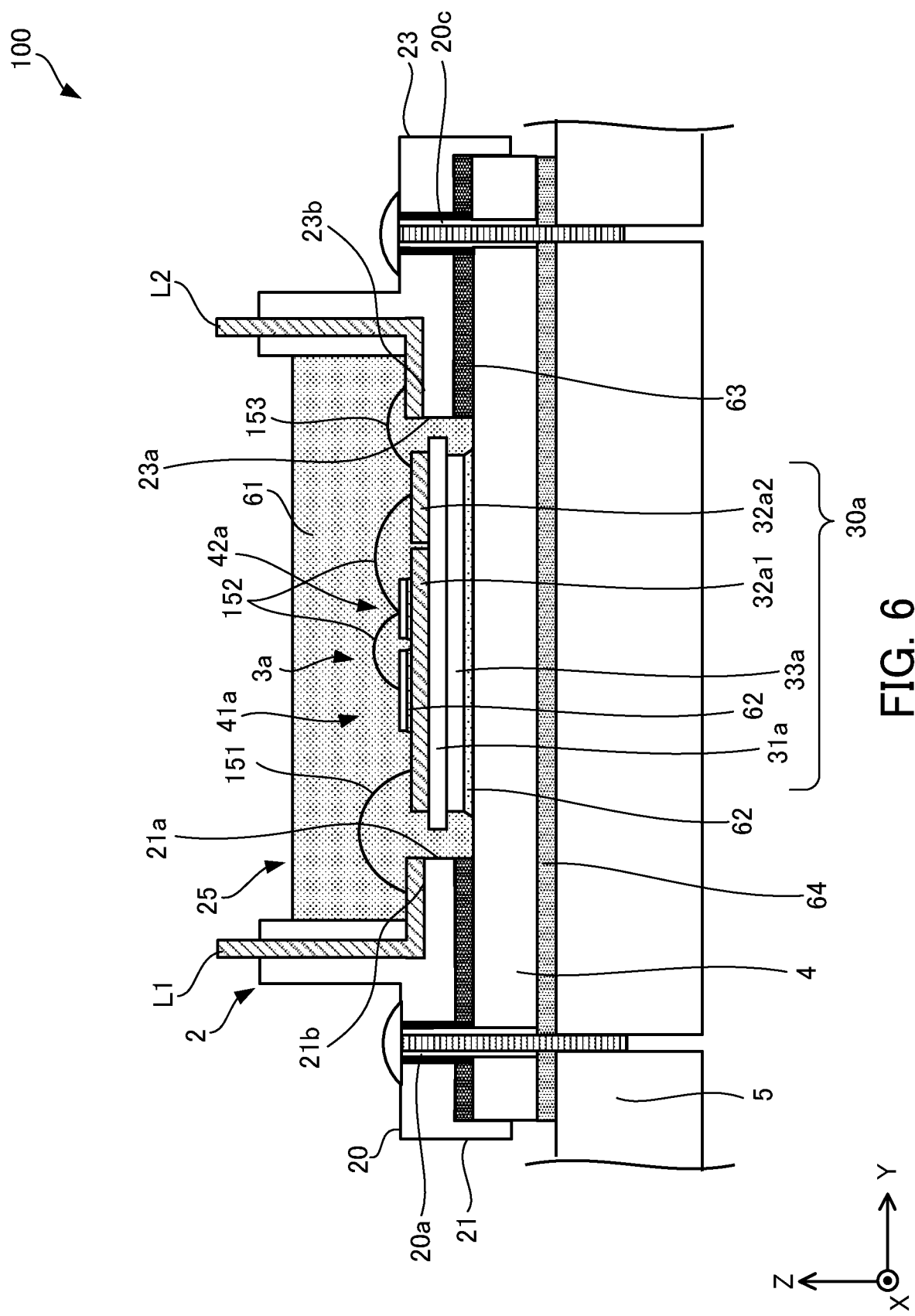
FIG. 6 is a sectional view of a semiconductor unit included in a semiconductor device according to a reference example.
Figure 7:
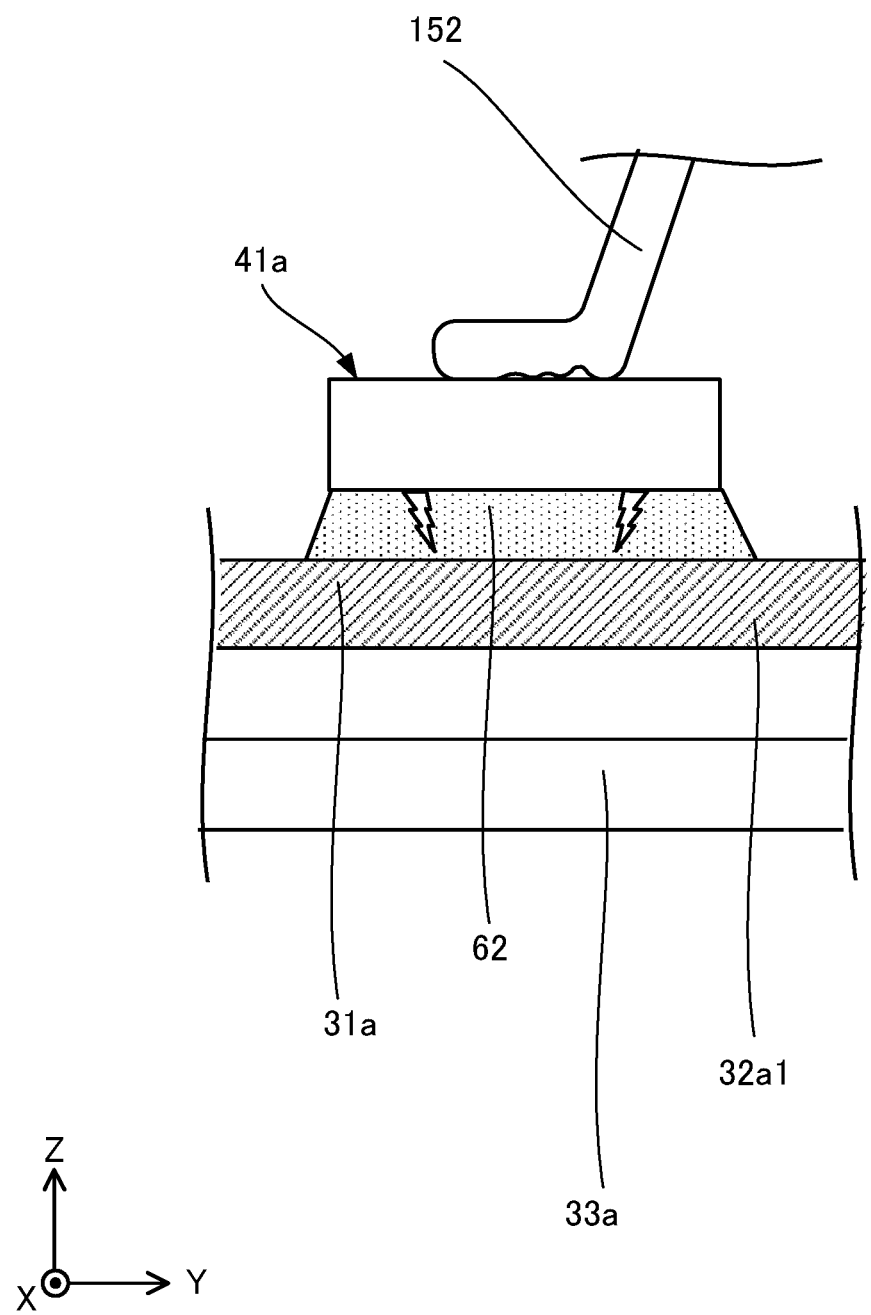
FIG. 7 is a sectional view of a wire connected to a semiconductor chip included in the semiconductor device according to the reference example.

Next, a semiconductor device 100 according to a reference example will be described with reference to FIGS. 6 and 7. FIG. 6 is a sectional view of a semiconductor unit included in a semiconductor device according to a reference example. FIG. 7 is a sectional view of a wire connected to a semiconductor chip included in the semiconductor device according to the reference example. FIG. 6 is a sectional view of a portion of the semiconductor device 100 taken along a line parallel to the X-Z plane. FIG. 7 is an enlarged sectional view of a semiconductor chip 41a and components therearound in FIG. 6.

As is the case with the semiconductor device 1, the semiconductor device 100 includes semiconductor units 3a and 3b, a case 2, and a heat dissipation base board 4. However, the locations of various kinds of terminals included in the case 2 differ from those in the case 2 of the semiconductor device 1.

As illustrated in FIG. 6, the case 2 of the semiconductor device 100 includes an individual main terminal L1 connected to the positive electrode and an individual main terminal L2 connected to the load, these main terminals sandwiching the semiconductor unit 3a. The illustration of an individual main terminal connected to the negative electrode is omitted.

In addition, an individual wire 151 mechanically and electrically connects the individual main terminal L1 and a wiring plate 32a1. An individual wire 152 mechanically and electrically connects the output electrode on the front surface of an individual semiconductor chip 41a, the input electrode of an individual semiconductor chip 42a, and a wiring plate 32a2. In addition, an individual wire 153 mechanically and electrically connects the wiring plate 32a2 and the individual main terminal L2.

In the case of the semiconductor unit 3a of the semiconductor device 100, too, the negative electrode (low potential) is connected to the individual main terminal, the positive electrode (high potential) is connected to the individual main terminal L1, and the load (intermediate potential) is connected to the individual main terminal L2. In this case, when a control signal is inputted to the control electrode of the individual semiconductor chip 41a, a current from the individual main terminal L1 is inputted to the input electrode on the rear surface of the individual semiconductor chip 41a via the individual wire 151 and the wiring plate 32a1, and an output current is outputted from the output electrode 41a1 on the front surface of the individual semiconductor chip 41a. The output current flows through the wiring plate 32a2 via the individual wire 152. In addition, in this case, the output current flows through the individual wire 153 and is outputted from the individual main terminal L2.

The semiconductor chips 41a (or semiconductor chips 41b) of the semiconductor device 100 are heated as they operate. If the temperature of the semiconductor chips 41a (or the semiconductor chips 41b) exceeds their rated temperature, the semiconductor chips 41a (or the semiconductor chips 41b) malfunction. To prevent occurrence of this malfunction, deterioration determination is performed. For example, the deterioration determination is performed as follows. When the semiconductor chips 41a (or the semiconductor chips 41b) are in an on-state, the potentials of the main terminals (the main terminals L1 and L2) are detected, and the potential difference between the potentials (hereinafter referred to as an inter-main-terminal potential difference) is calculated. Next, the temperature of the semiconductor chips 41a (or the semiconductor chips 41b) is estimated based on the inter-main-terminal potential difference.

In addition, thermal stress is caused inside the semiconductor device 100 as the temperature of the semiconductor device 100 repeatedly rises and drops during an operation. As a result, deformation is caused inside the semiconductor device 100. For example, if the thermal stress is caused as described above, as illustrated in FIG. 7, a crack is caused in bonding material 62 that bonds a semiconductor chip 41a and the wiring plate 32a1. In addition, peeling is caused in the bonding between a wire 152 and a semiconductor chip 41a. The crack and peeling are due to deterioration of the semiconductor device 100.

Figure 8:
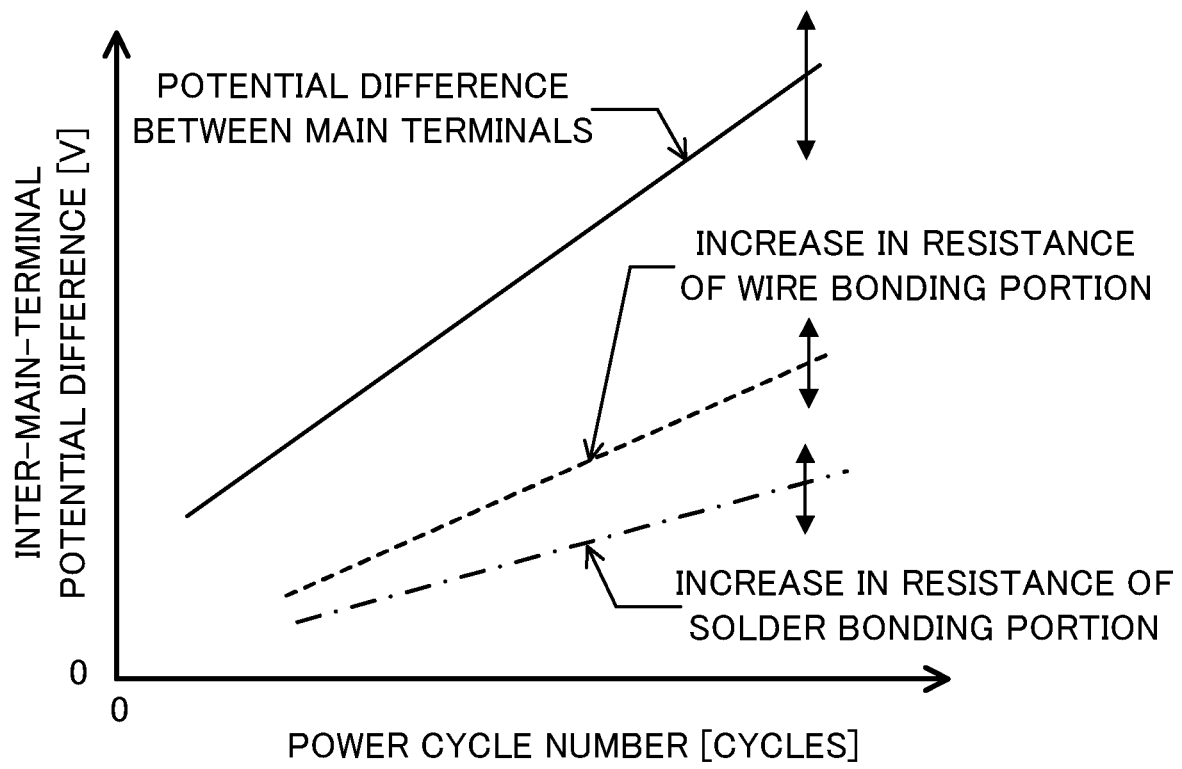
FIG. 8 is a graph illustrating an inter-main-terminal potential difference with respect to the number of power cycles of the semiconductor device according to the reference example.

Next, the inter-main-terminal potential difference based on the number of power cycles of the semiconductor device 100 will be described with reference to FIG. 8. FIG. 8 is a graph illustrating the inter-main-terminal potential difference with respect to the number of power cycles of the semiconductor device according to the reference example.

FIG. 8 illustrates the inter-main-terminal potential difference obtained when the semiconductor device 100 performs a power cycle test. In the power cycle test, solder was used as the bonding material 62. The potential difference is the potential difference between the potential at the main terminal L1 (connection point P) and the potential at the main terminal L2 (connection point U) of the semiconductor device 100 illustrated in FIG. 6. The horizontal axis represents the power cycle number (cycles), and the vertical axis represents the inter-main-terminal potential difference (V). In addition, the graph in FIG. 8 also illustrates change in resistance at a bonding portion (a wire bonding portion) between a wire 152 and a semiconductor chip 41a, along with the inter-main-terminal potential difference of the semiconductor device 100. The graph in FIG. 8 also illustrates change in resistance at bonding material 62 (a solder bonding portion) that bonds the individual semiconductor chip 41a and the wiring plate 32a1.

As illustrated in FIG. 8, the inter-main-terminal potential difference between the main terminals L1 and L2 increases as the number of power cycles increases. In the case illustrated in FIG. 6, the inter-main-terminal potential difference between the main terminals L1 and L2 is based on a current path including the main terminal L1, the individual wire 151, the wiring plate 32a1, the bonding material 62 (solder), the individual wire 152, the wiring plate 32a2, the individual wire 153, and the main terminal L2. In the case of this inter-main-terminal potential difference, as the number of power cycles increases, thermal stress is caused inside the semiconductor device 100, and the wire bonding portions and the solder bonding portions are deteriorated. Thus, the inter-main-terminal potential difference is increased by the resistance increased particularly in the wire bonding portions and the solder bonding portions deteriorated as the number of power cycles increases.

In addition, the increase of the inter-main-terminal potential difference varies depending on the members used in the semiconductor device 100. The degree of the deterioration of the individual solder bonding portion (bonding material 62) included in the current path between the main terminals L1 and L2 depends on, for example, the kind, the thickness, and the soldering temperature of the individual solder bonding portion. The degree of the deterioration of each wire 152 included in the current path between the main terminals L1 and L2 also depends on, for example, the kind, the diameter, and the wire bonding conditions of the wire 152. Thus, as illustrated in FIG. 8, the change (increase) in the resistance of the wire bonding portions and the solder bonding portions also varies. Thus, the potential difference between the main terminals located in a path including the wire bonding portions and the solder bonding portions also varies.

The inter-main-terminal potential difference of the semiconductor device 100 affected by the deterioration of the solder bonding portions and the wire bonding portions also varies. Thus, if the inter-main-terminal potential difference is used for the deterioration determination, the accuracy of the determination result deteriorates, and therefore, it is difficult to appropriately determine the state of the semiconductor device 100. This could deteriorate the reliability of the semiconductor device 100.

Figure 9:
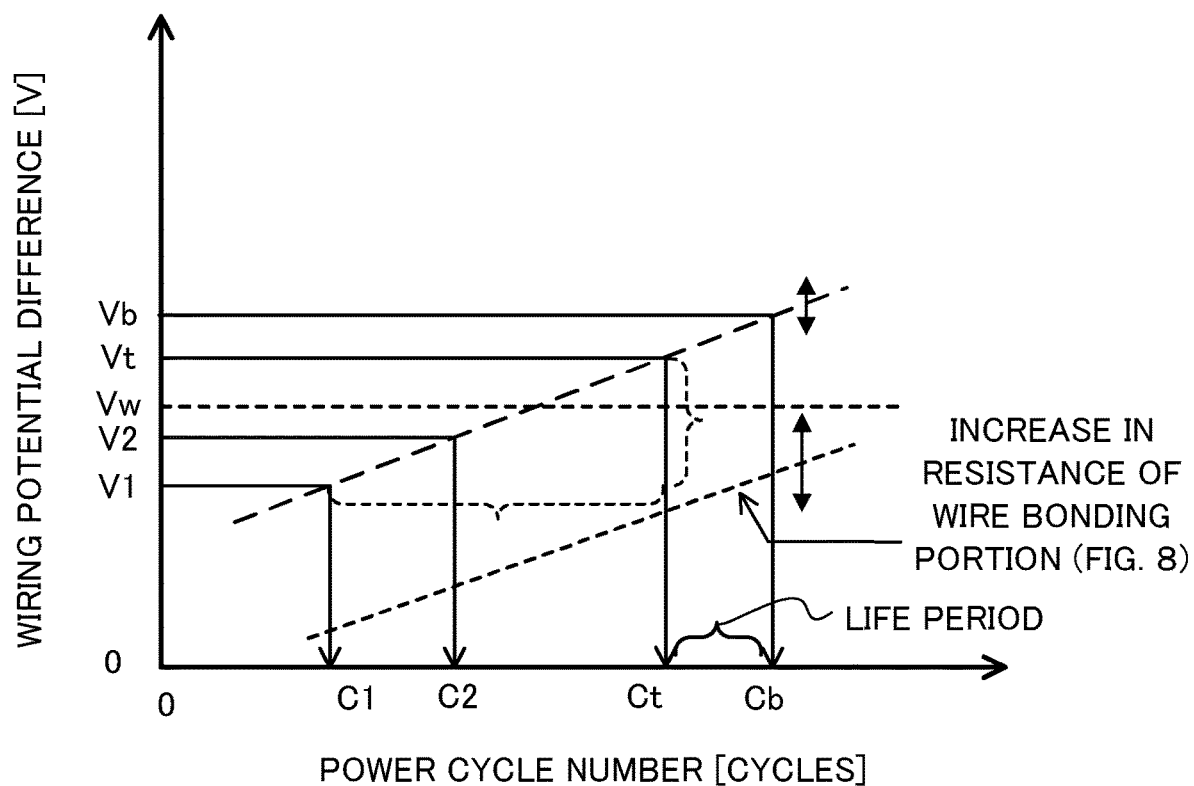
FIG. 9 is a graph illustrating an inter-emitter-terminal potential difference with respect to the number of power cycles of the semiconductor device according to the first embodiment.

Next, a deterioration determination method for the semiconductor device 1 according to the first embodiment will be described with reference to FIGS. 1, 2, and 9. FIG. 9 is a graph illustrating an inter-emitter-terminal potential difference with respect to the number of power cycles of the semiconductor device according to the first embodiment.

FIG. 9 illustrates an inter-emitter-terminal potential difference obtained when the semiconductor device 1 performs a power cycle test. The inter-emitter-terminal potential difference is the potential difference (hereinafter referred to as a wiring potential difference, as needed) between the emitter terminal 28d (the connection point E12) and the emitter terminal 26c (the connection point E11) of the semiconductor device 1 illustrated in FIG. 1. The wiring potential difference may be the wiring potential difference between the emitter terminal 28c (the connection point E21) and the emitter terminal 26d (the connection point E22) of the semiconductor device 1. The horizontal axis represents the power cycle number (cycles), and the vertical axis represents potential difference (V). In the inter-emitter-terminal addition, FIG. 9 also illustrates the increase in the resistance of the wire bonding portions in FIG. 8 (a lower dashed line) for comparison. FIG. 9 also illustrates a wiring potential difference Vw, which is a threshold at which the wire bonding portions deteriorate. If the wiring potential difference reaches this wiring potential difference Vw, the wire bonding deterioration to be described below is caused. Wiring potential differences V1, V2, Vt, and Vb and power cycle numbers C1, C2, Ct, and Cb corresponding thereto will be described in the following second embodiment.

In FIG. 1, the wiring potential difference between the emitter terminals 28d and 26c also increases as the number of power cycles increases, as illustrated in FIG. 9. In the case in FIG. 1, the wiring potential difference between the emitter terminals 28d and 26c is based on a current path including the emitter terminal 28d, the detection wire 53d, the wiring plate 32a2, the wiring wires 58a, the wires 57a1 to 57a4, the wiring plate 32a4, the sense wire 51c, the emitter terminal 26c, and the front surfaces of the semiconductor chips 41a and 42a. Unlike the current path according to the reference example, this current path is not affected by the resistance of the solder bonding portions of the bonding material 62 (solder). That is, the wiring potential difference between the emitter terminals 28d and 26c is affected only by the resistance increased by the deterioration of the wire bonding portions. Thus, the wiring potential difference between the emitter terminals 28d and 26c varies less than the inter-main-terminal potential difference according to the reference example.

In addition, the emitter terminal 28d is located to face the +X direction end of the wiring plate 32a2. Accordingly, the detection wire 53d connecting the emitter terminal 28d and the wiring plate 32a2 also extends from the +X direction end of the wiring plate 32a2 to the emitter terminal 28d. As described above, the current outputted from the semiconductor chips 41a flows through the wiring plate 32a2 along the arrow A1 in a direction approximately parallel to the long side walls 21 and 23 toward the short side wall 22. The wiring direction of the detection wire 53d forms an approximately right angle with the direction of this current flow. Thus, the detection wire 53d is not affected much by the magnetic field that is generated in a clockwise direction with respect to the direction of the current flowing through the wiring plate 32a2. The potential obtained from the emitter terminal 28d via the detection wire 53d does not include noise and varies less.

Therefore, by using the wiring potential difference between the emitter terminals 28d and 26c, deterioration of the semiconductor device 1 is determined more accurately than by using the inter-main-terminal potential difference according to the reference example.

Figure 10:
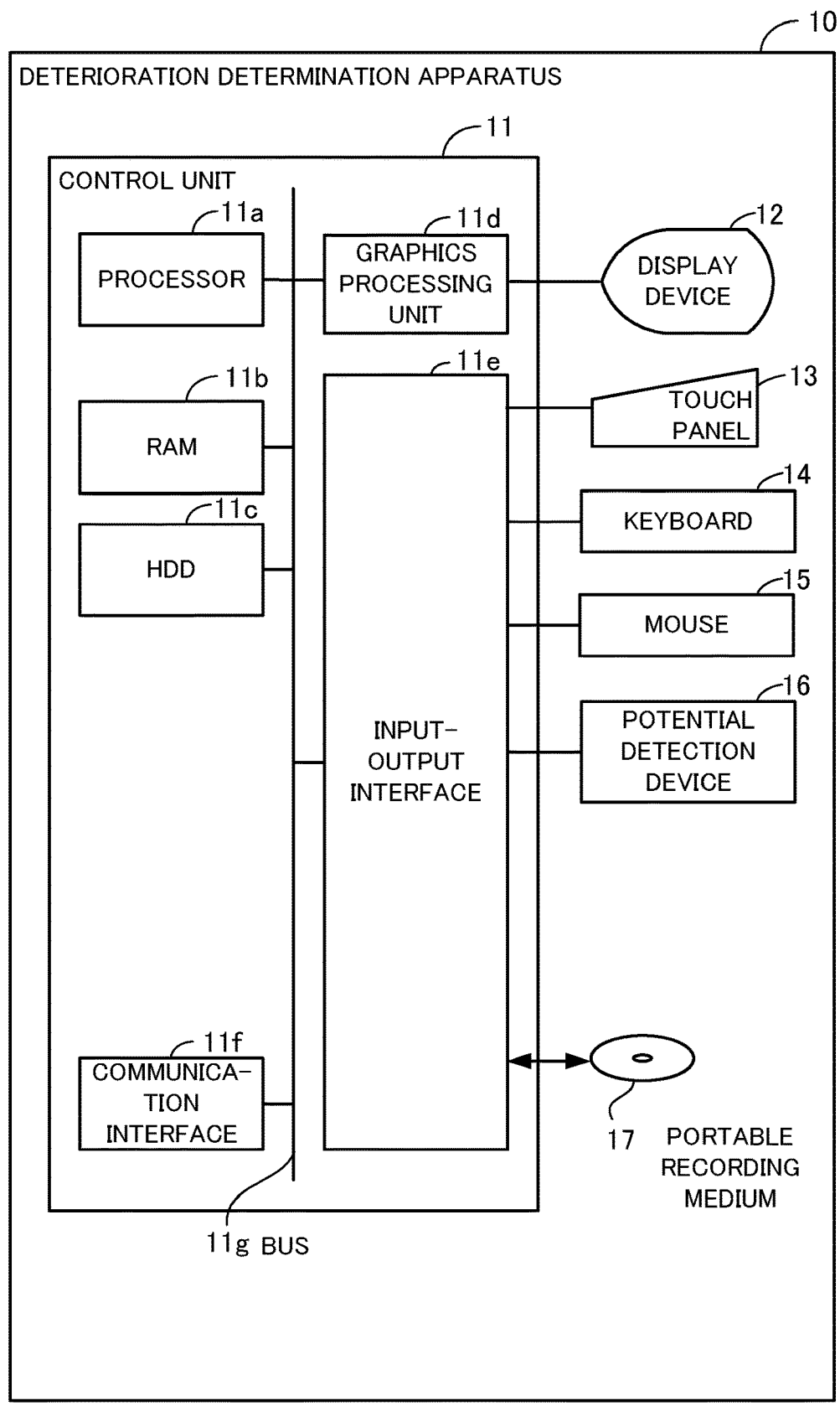
FIG. 10 is a functional block diagram illustrating functions included in a deterioration determination apparatus according to the first embodiment.

Next, a deterioration determination apparatus that determines deterioration of the semiconductor device 1 will be described with reference to FIG. 10. FIG. 10 is a functional block diagram illustrating functions of a deterioration determination apparatus according to the first embodiment. This deterioration determination apparatus 10 includes a control unit 11, a display device 12, a touch panel 13, a keyboard 14, a mouse 15, and a potential detection device 16.

The control unit 11 includes a processor 11a, a random access memory (RAM) 11b, a hard disk drive (HDD) 11c, a graphics processing unit 11d, an input-output interface 11e, and a communication interface 11f. These components are connected to each other via a bus 11g. A specific example of the control unit 11 is a computer.

The processor 11a controls an overall operation of the deterioration determination apparatus 10. The processor 11a is, for example, a central processing unit (CPU). The processor 11a calculates the difference between detected potentials, performs a predetermined process, and determines whether the semiconductor device 1 is deteriorated, by using a predetermined application. In addition, the processor 11a creates a predetermined graph based on the calculated potential difference and estimates the life period of the semiconductor device 1 from the graph.

An operating system (OS) program executed by the processor 11a and at least a part of an application program are temporarily stored in the RAM 11b. In addition, various kinds of data needed for the process performed by the processor 11a is stored in the RAM 11b.

An OS, an application program, and information about values detected from the semiconductor device 1 may be stored in the HDD 11c. Another recording device such as a solid-state drive (SSD) may alternatively be used as the HDD 11c.

The display device 12 is connected to the graphics processing unit 11d. The graphics processing unit 11d is controlled by the processor 11a and causes the display device 12 to display various kinds of information such as an operation guide screen for performing the deterioration determination and a deterioration determination result screen. While not illustrated, the deterioration determination apparatus 10 may include not only the graphics processing unit 11d but also an audio processing unit. The audio processing unit is connected to a device such as a speaker capable of outputting audio. The audio processing unit is controlled by the processor 11a and causes a speaker or the like to output various kinds of information such as an operation guide or a warning notifying that the semiconductor device 1 is deteriorated, by using audio guidance.

The input-output interface 11e is connected to the touch panel 13, the keyboard 14, the mouse 15, and the potential detection device 16. The input-output interface 11e is controlled by the processor 11a, notifies an individual unit connected thereto of an instruction from the processor 11a, and supplies information acquired from an individual unit to the processor 11a via the bus 11g.

The communication interface 11f is connected to an external network and as needed, exchanges data with a host computer. In addition, the communication interface 11f transmits secret numbers, detected values, calculated values, determination results, etc. to the host computer. In addition, the communication interface 11f receives, for example, information needed for the deterioration determination from the host computer, as needed.

The display device 12 is a display, for example. The display device 12 displays image information supplied from the control unit 11. The touch panel 13, the keyboard 14, and the mouse 15 are input devices for inputting, for example, information about execution of the deterioration determination and information about numerical values when the deterioration determination is performed.

The semiconductor device 1 is set in the potential detection device 16. The positive electrode and the negative electrode of the potential detection device 16 are connected to the main terminals 29a and 26a of the semiconductor device 1. The potential detection device 16 applies a control signal to the semiconductor chips 41a (or the semiconductor chips 41b) of the semiconductor device 1 at predetermined timing and detects the potentials from the emitter terminals 28d and 26c (or the emitter terminals 26d and 28c). The potential detection device 16 also detects values needed for various processes other than this detection process.

A portable recording medium 17 is a recording medium such as a digital versatile disc (DVD) or a compact disc (CD). The portable recording medium 17 stores detected potentials, calculated potential differences, graphs, deterioration determination results, etc.

Figure 11:
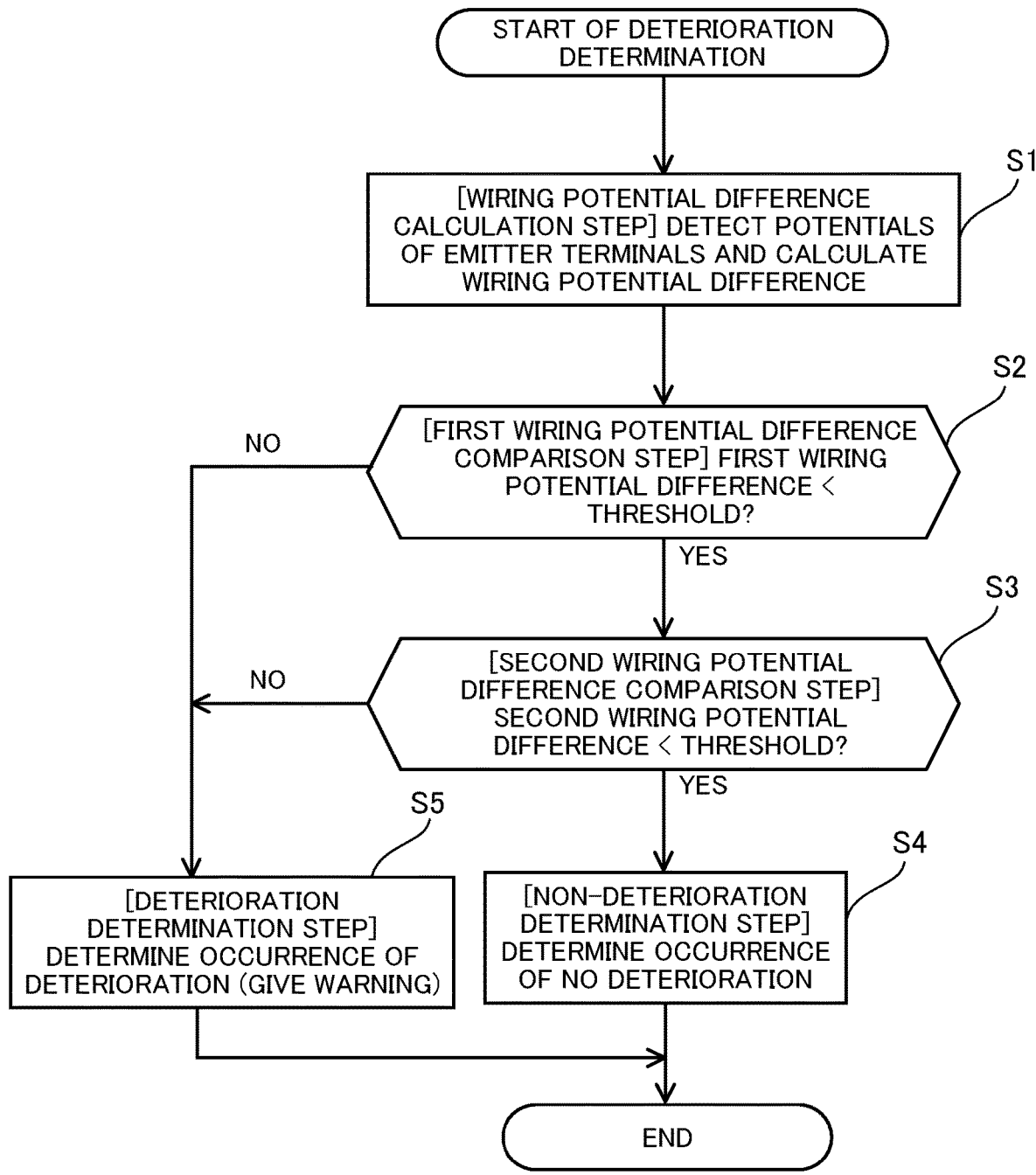
FIG. 11 is a flowchart illustrating a deterioration determination method according to the first embodiment.

Next, a method for determining deterioration of the semiconductor device 1 performed by the deterioration determination apparatus 10 will be described with reference to FIG. 11. FIG. 11 is a flowchart illustrating a deterioration determination method according to the first embodiment. As a preparation, the semiconductor device 1 is set in the potential detection device 16 connected to the deterioration determination apparatus 10, and various kinds of terminals of the semiconductor device 1 are connected to the potential detection device 16. Upon completion of this preparation, the deterioration determination process may be started by using the touch panel 13, the keyboard 14, and the mouse 15. When the deterioration determination process is started, the following process is performed.

First, the control unit 11 performs a wiring potential difference calculation step in which the potential detection device 16 calculates the inter-emitter-terminal potential difference (the wiring potential difference) (step S1). The control unit 11 causes the potential detection device 16 to apply a high potential (the positive electrode) to the main terminals 29a of the semiconductor device 1 and a low potential (the negative electrode) to the main terminals 26a of the semiconductor device 1 and to apply a control signal to the control terminal 26b of the semiconductor device 1. The potential detection device 16 detects the potentials of the output electrodes 41a1 of the semiconductor chips 41a from the emitter terminals 28d and 26c. The control unit 11 calculates a first wiring potential difference from the difference between the potential of the emitter terminal 28d and the potential of the emitter terminal 26c detected by the potential detection device 16.

In addition, the control unit 11 causes the potential detection device 16 to apply a control signal to the control terminal 28b of the semiconductor device 1. The potential detection device 16 detects the potentials of the output electrodes 41b1 of the semiconductor chips 41b from the emitter terminals 28c and 26d. The control unit 11 calculates a second wiring potential difference from the difference between the potential of the emitter terminal 28c and the potential of the emitter terminal 26d detected by the potential detection device 16.

Next, the control unit 11 performs a first wiring potential difference comparison step of comparing the first wiring potential difference calculated in step S1 with a predetermined threshold (step S2). The control unit 11 compares the first wiring potential difference calculated in step S1 with a predetermined threshold. In the present embodiment, a potential difference at which a wire bonding portion of a wiring wire 58a could be deteriorated is set as the threshold. If the first wiring potential difference is less than the predetermined threshold, the process proceeds to step S3. If the first wiring potential difference is equal to or more than the predetermined threshold, the process proceeds to step S5.

Next, the control unit 11 performs a second wiring potential difference comparison step of comparing the second wiring potential difference calculated in step S1 with a predetermined threshold (step S3). The control unit 11 compares the second wiring potential difference calculated in step S1 with a predetermined threshold. In the present embodiment, a potential difference at which a wire bonding portion of a wiring wire 58b could be deteriorated is set as the threshold. If the second wiring potential difference is less than the predetermined threshold, the process proceeds to step S4. If the second wiring potential difference is equal to or more than the predetermined threshold, the process proceeds to step S5.

Next, the control unit 11 performs non-deterioration determination step of determining that the semiconductor device 1 is not deteriorated (step S4). Because both the first wiring potential difference and the second wiring potential difference are less than their respective predetermined thresholds, the control unit 11 determines that the semiconductor device 1 is not deteriorated. For example, the control unit 11 may display information notifying the user that the semiconductor device 1 is not deteriorated on the display device 12.

Next, the control unit 11 performs a deterioration determination step of determining that the semiconductor device 1 is deteriorated (step S5). Because at least one of the first wiring potential difference and the second wiring potential difference is equal to or more than its corresponding predetermined threshold, the control unit 11 determines that the semiconductor device 1 is deteriorated. For example, the control unit 11 may give a warning by displaying information notifying the user that the semiconductor device 1 is deteriorated on the display device 12.

The deterioration determination apparatus 10 accurately determines deterioration of the semiconductor device 1 by performing the deterioration determination method as described above. A value at which a wire bonding portion is inevitably deteriorated and which is compared with the corresponding one of the first and second wiring potential differences may be set as the predetermined threshold in step S2 or S3. Steps S2 and S3 may be performed in reverse order.

The above-described semiconductor device 1 includes the plurality of semiconductor chips 41a, the wiring plates 32a1 and 32a2, the wiring wires 58a, the emitter terminal 28d, and the detection wire 53d. The plurality of semiconductor chips 41a each have an output electrode 41a1 on its front surface and an input electrode on its rear surface. The plurality of semiconductor chips 41a are arranged along the arrow A1, and the input electrodes of the plurality of semiconductor chips 41a are bonded to the wiring plate 32a1. The wiring plate 32a2 neighbors the wiring plate 32a1 and extends along the arrow A1. The wiring wires 58a connect the output electrodes 41a1 of the plurality of semiconductor chips 41a and the front surface of the wiring plate 32a2. The emitter terminal 28d is formed in the long side wall 23 that is located at a side of the wiring plate 32a2 that is opposite to a side where the wiring plate 32a1 is disposed. The detection wire 53d connects the front surface of the wiring plate 32a2 and the emitter terminal 28d. In the case of the semiconductor device 1, the potential detected from the emitter terminal 28d is the potential that has been outputted from the output electrodes 41a1 of the semiconductor chips 41a, and the corresponding current flows through the wiring wires 58a, the wiring plate 32a2, and the detection wire 53d. Thus, the potential detected from the emitter terminal 28d is mainly affected by deterioration of the wire bonding portions of the wiring wires 58a. However, the potential detected from the emitter terminal 28d is not affected by deterioration of the solder bonding portions of the bonding material 62 bonding the input electrodes of the semiconductor chips 41a and the wiring plate 32a1. In addition, the detection wire 53d is not affected much by the magnetic field that is generated in a clockwise direction with respect to the direction of the current flowing through the wiring plate 32a2. The potential obtained from the emitter terminal 28d via the detection wire 53d does not include noise and varies less. Thus, the potential detected from the emitter terminal 28d varies less, and a deteriorated portion is easily determined. Thus, by using this potential, it is possible to accurately determine deterioration of the semiconductor device 1 and to maintain the reliability of the semiconductor device 1.

Second Embodiment

A deterioration determination method according to a second embodiment different from that according to the first embodiment will be described. In the second embodiment, the semiconductor device 1 and the deterioration determination apparatus 10 according to the first embodiment will be used.

In the deterioration determination method according to the first embodiment, as illustrated in FIG. 9, by using the potential difference (the wiring potential difference) between the emitter terminals 26c and 28c (the emitter terminals 26d and 28d) of the semiconductor device 1, deterioration of the bonding portions of the wiring wires 58a (the wiring wires 58b) is mainly determined. However, in the deterioration determination method using the inter-main-terminal potential difference (the potential difference from the main terminals 27a (connection point U) to the main terminals 29a (connection point P) or the potential difference from the main terminals 26a (connection point N) to the main terminals 27a (connection point U)) illustrated in FIG. 8 according to the reference example, as described above, the impact of the deterioration of the solder bonding portions is also included, in addition to the impact of the deterioration of the wire bonding portions. That is, the difference between the inter-main-terminal potential difference and the wiring potential difference between the emitter terminals 26c and 28c (the emitter terminals 26d and 28d) of the semiconductor device 1 is considered to mainly correspond to the deterioration of the solder bonding portions. In the second embodiment, a deterioration determination method using this difference will be described with reference to FIGS. 8 and 9 and FIGS. 12 to 14.

Figure 12:
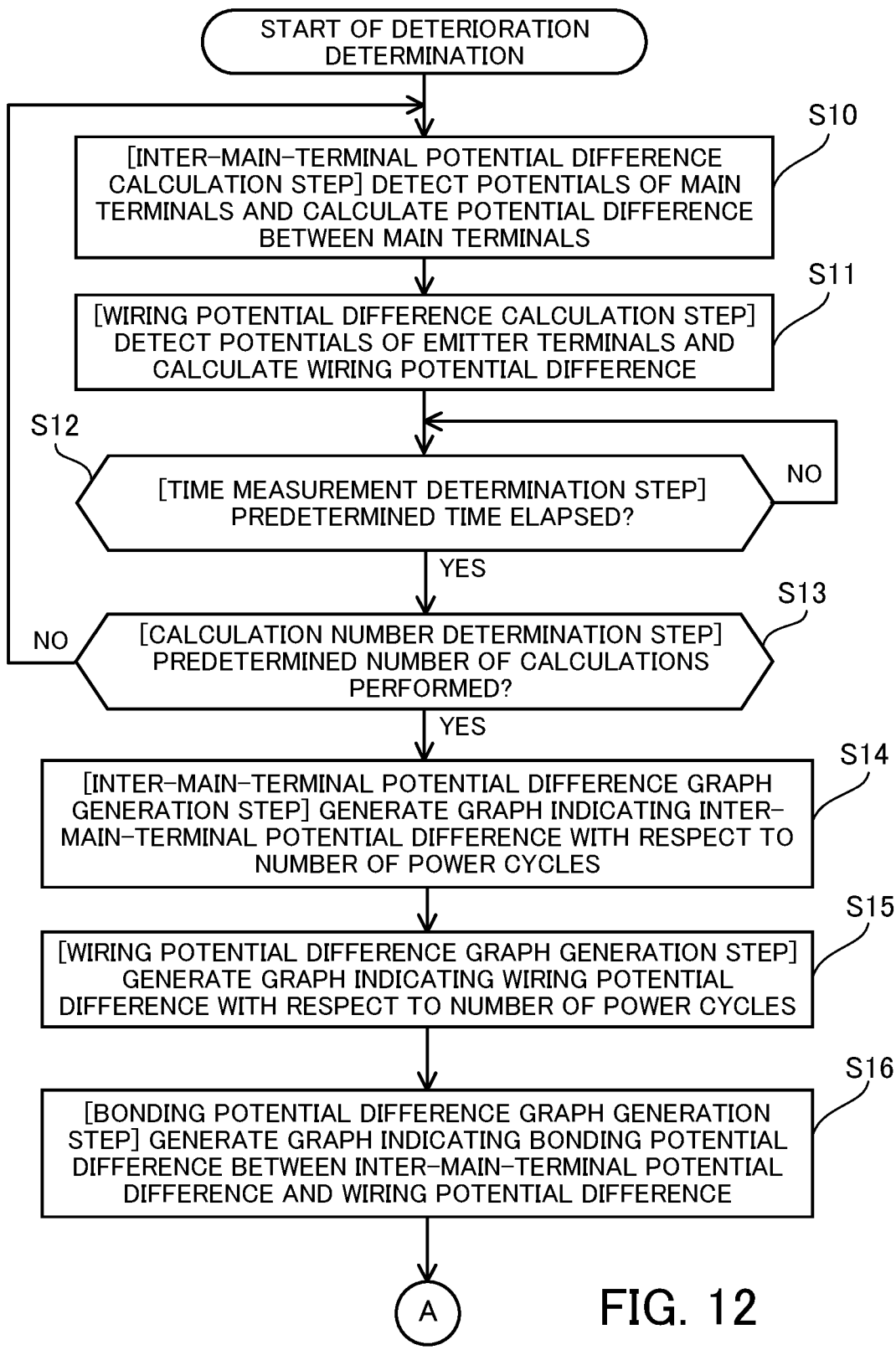
FIG. 12 is the first half of a flowchart illustrating a deterioration determination method according to a second embodiment.
Figure 13:
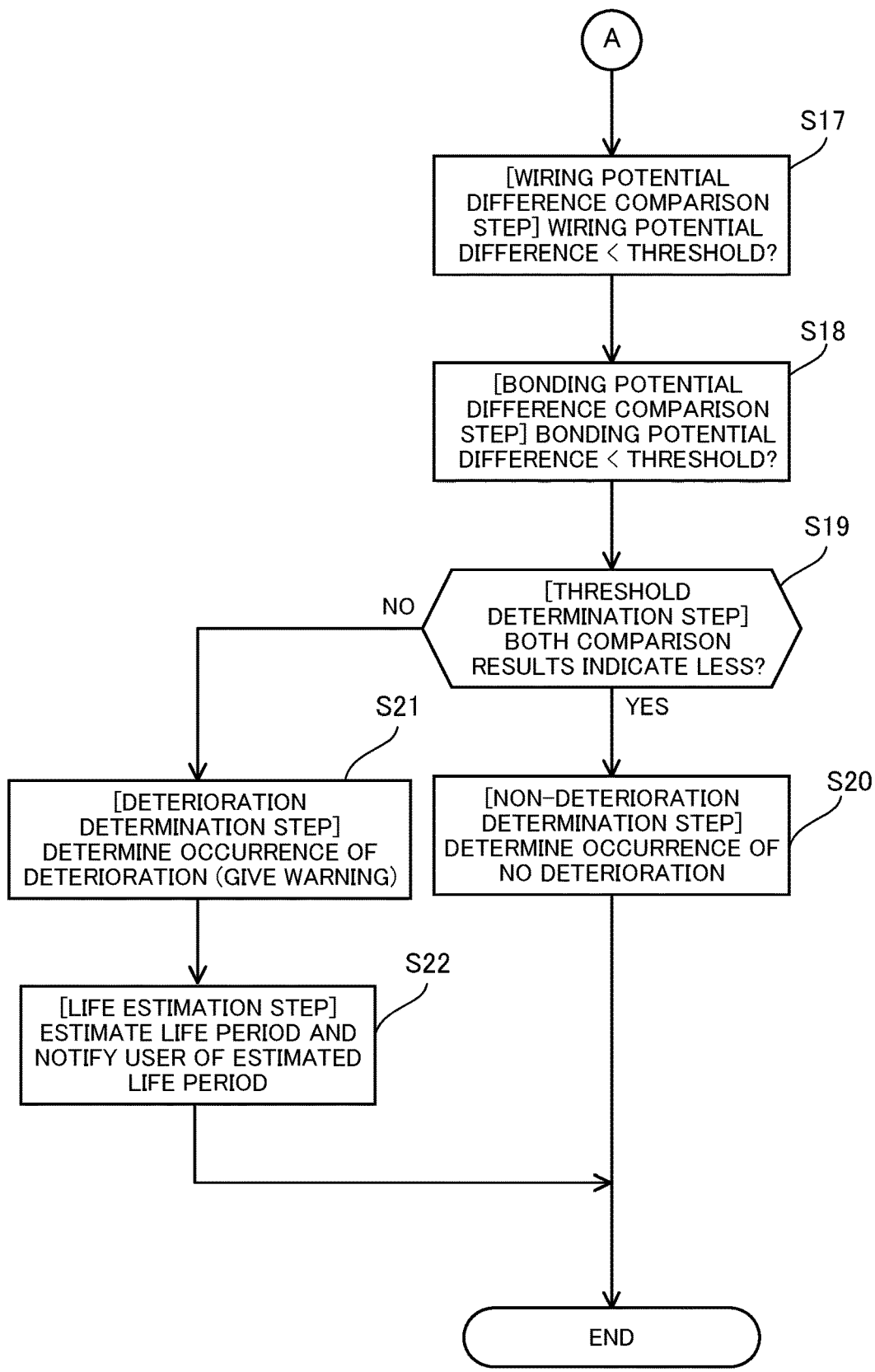
FIG. 13 is the second half of the flowchart illustrating the deterioration determination method according to the second embodiment.
Figure 14:
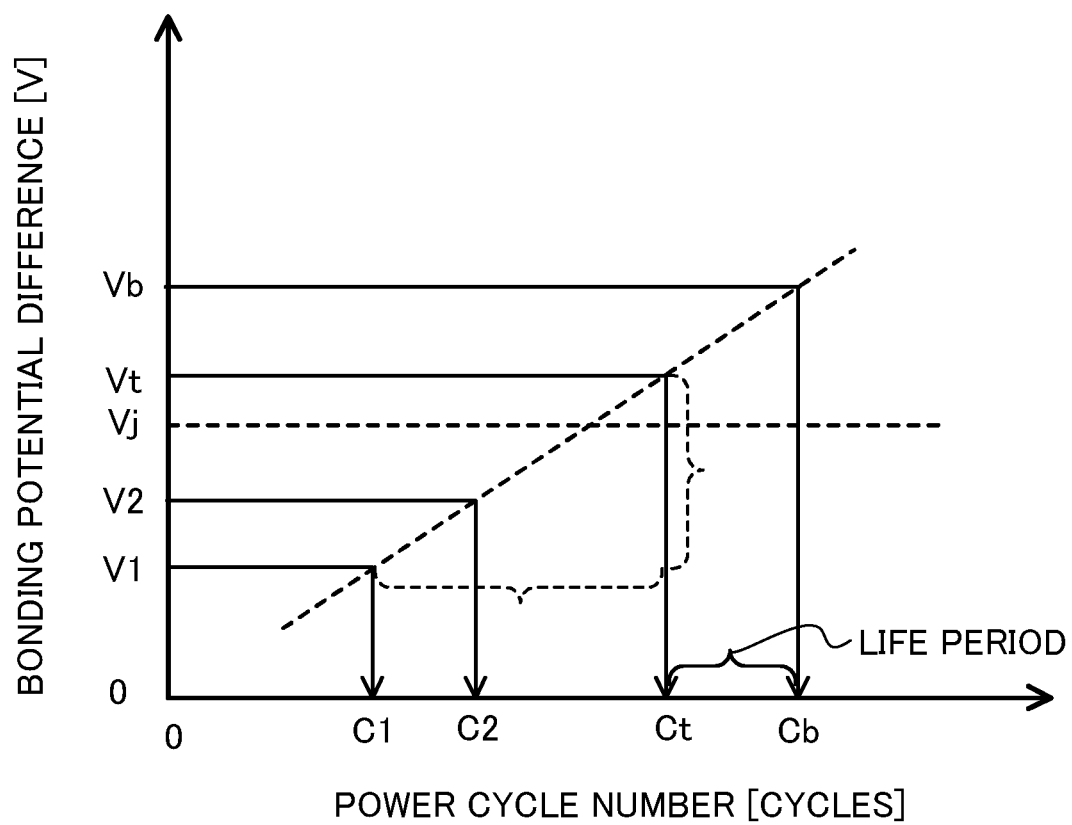
FIG. 14 is a graph illustrating a potential difference (a bonding potential difference) between an inter-emitter terminal potential difference and an inter-main-terminal potential difference with respect to the number of power cycles of a semiconductor device according to the second embodiment.

FIGS. 12 and 13 are each a flowchart illustrating a deterioration determination method according to the second embodiment. FIG. 14 is a graph illustrating the potential difference (a bonding potential difference) between the inter-emitter-terminal potential difference and the inter-main-terminal potential difference with respect to the number of power cycles of the semiconductor device according to the second embodiment. In FIG. 14, the horizontal axis represents the power cycle number (cycles), the vertical axis represents the bonding potential difference (V), which is the potential difference between the inter-emitter-terminal potential difference and the inter-main-terminal potential difference. In addition, the second embodiment performs a deterioration determination per predetermined cycle number while performing a power cycle test on the semiconductor device 1.

First, the control unit 11 performs an inter-main-terminal potential difference calculation step of causing the potential detection device 16 to calculate the inter-main-terminal potential difference (step S10). The control unit 11 causes the potential detection device 16 to apply a high potential (the positive electrode) to the main terminals 29a of the semiconductor device 1 and a low potential (the negative electrode) to the main terminals 26a and to apply a control signal to the control terminal 26b of the semiconductor device 1. The potential detection device 16 detects the potentials of the main terminals 29a and 26a, and the control unit 11 calculates the potential difference (the inter-main-terminal potential difference) between the detected potentials. The potential difference between the main terminals 27a and 26a may be calculated alternatively.

Next, the control unit 11 performs a wiring potential difference calculation step of causing the potential detection device 16 to calculate the inter-emitter-terminal potential difference (the wiring potential difference) (step S11). While maintaining the application state in step S10, the potential detection device 16 detects the potentials from the emitter terminals 28d and 26c, the potentials having been outputted from the semiconductor chips 41a. The control unit 11 calculates the wiring potential difference between the detected potentials of the emitter terminals 28d and 26c. The wiring potential difference between the emitter terminals 28c and 26d may be calculated alternatively.

Next, the control unit 11 performs a time measurement determination step of determining whether a predetermined time has elapsed since the calculation in step S11 (step S12). While maintaining the application state in step S10, the control unit 11 determines whether a predetermined time has elapsed since the calculation in step S11. The predetermined time in this case may be the number of power cycles in the power cycle test. The following description assumes that the predetermined time interval is 1000 power cycles. In this case, after performing the calculation of the n-th cycle in step S10 or S11, the control unit 11 determines whether the number of power cycles has reached n+1000. The time interval is not limited to 1000 cycles. The time interval may be another number of cycles, such as 2000 cycles or 3000 cycles. If the predetermined time has elapsed, the process proceeds to step S13. If the predetermined time has not elapsed, the control unit 11 waits (returns to step S12) until the predetermined time elapses (until the predetermined power cycle number has been reached).

Next, the control unit 11 performs a calculation number determination step of determining the number of calculations performed in step S10 or S11 (step S13). The control unit 11 determines whether the number of calculations in step S10 or S11 exceeds a predetermined number. If the number of calculations exceeds the predetermined number, the process proceeds to step S14. If the number of calculations is equal to or less than the predetermined number, the process returns to step S10. For example, the following description assumes that the predetermined number is 2. In this case, first, the control unit 11 calculates the wiring potential difference between the main terminals 29a and 26a and the inter-main-terminal potential difference between the emitter terminals 28d and 26c of the semiconductor device 1. Next, after a predetermined time, the control unit 11 calculates the inter-main-terminal potential difference between the main terminals 29a and 26a and the wiring potential difference between the emitter terminals 28d and 26c again. As a result, the number of calculations reaches 2, and the process proceeds to step S14.

Next, the control unit 11 performs an inter-main-terminal potential difference graph generation step of generating a graph indicating the inter-main-terminal potential differences calculated in step S10 (step S14). The control unit 11 generates a graph indicating the individual inter-main-terminal potential difference with respect to a predetermined time (the number of power cycles) from the inter-main-terminal potential differences obtained by performing step S10 the predetermined number of times. The generated graph indicates a regression line or an approximate curve depending on the number of calculations (the number of potential differences). This graph is, for example, the graph in FIG. 8 indicating the inter-main-terminal potential difference.

Next, the control unit 11 performs a wiring potential difference graph generation step of generating a graph indicating the wiring potential differences calculated in step S11 (step S15). The control unit 11 generates a graph indicating the individual wiring potential difference with respect to a predetermined time (the number of power cycles) from the wiring potential differences obtained by performing step S11 the predetermined number of times. The generated graph indicates a regression line or an approximate curve depending on the number of calculations (the number of potential differences). This graph is, for example, the graph in FIG. 9 indicating the wiring potential difference.

Next, the control unit 11 performs a bonding potential difference graph generation step of generating a graph indicating the bonding potential difference, which is the difference between the inter-main-terminal potential difference and the wiring potential difference (step S16). Specifically, the control unit 11 calculates the difference between each inter-main-terminal potential difference calculated in step S10 and a corresponding one of the wiring potential differences calculated in step S11 and generates a graph indicating the individual difference as the bonding potential difference. This graph is, for example, the graph as illustrated in FIG. 14.

Next, the control unit 11 performs a wiring potential difference comparison step of comparing the wiring potential difference calculated last in a predetermined number of calculations in step S11 with a predetermined threshold (step S17). The control unit 11 compares the wiring potential difference (for example, the wiring potential difference Vt) calculated last in a predetermined number of calculations (for example, the power cycle number Ct) in step S11 with a predetermined threshold. This threshold corresponds to the value of the wiring potential difference at which a wire bonding portion could be deteriorated. In this case, for example, the wiring potential difference Vw used as the threshold in FIG. 9 may be used. FIG. 9 illustrates a case in which the wiring potential difference Vt is equal to or more than the wiring potential difference Vw. If the wiring potential difference calculated in step S11 is less than the predetermined threshold, "less" is determined. If the wiring potential difference calculated in step S11 is equal to or more than the predetermined threshold, "more" is determined.

Next, the control unit 11 performs a bonding potential difference comparison step of comparing the bonding potential difference between the wiring potential difference and inter-main-terminal potential difference calculated last in a predetermined number of calculations from the bonding potential difference graph generated in step S16 with a predetermined threshold (step S18). Based on the graph generated in step S16, the control unit 11 compares the bonding potential difference (for example, a bonding potential difference Vt) corresponding to the last calculation (for example, the power cycle number Ct) in a predetermined number of calculations with a predetermined threshold. This threshold is the value of the bonding potential difference at which solder bonding deterioration could be caused. For example, in this case, a bonding potential difference Vj used as the threshold in FIG. 14 may be used. FIG. 14 illustrates a case in which the bonding potential difference Vt is equal to or more than the bonding potential difference Vj. If the bonding potential difference based on the graph generated in step S16 is less than the predetermined threshold, "less" is determined. If the bonding potential difference based on the graph generated in step S16 is equal to or more than the predetermined threshold, "more" is determined.

Next, the control unit 11 performs a threshold determination step of determining whether both of the comparison results in the comparison steps in steps S17 and S18 with respect to their respective thresholds indicate "less" (step S19). If both of the comparison results indicate "less", the process proceeds to step S20. If either one of the comparison steps indicates "more", the process proceeds to step S21.

Next, the control unit 11 performs a non-deterioration determination step of determining that the semiconductor device 1 is not deteriorated (step S20). Because the wiring potential difference calculated in step S11 and the bonding potential difference based on the graph generated in step S16 are less than their respective predetermined thresholds, the control unit 11 determines that the semiconductor device 1 is not deteriorated. In this case, it is assumed that no crack or peeling has occurred particularly in any of the wire bonding portions of the wiring wires 58a or any of the solder bonding portions of the bonding material 62 included in the semiconductor device 1. In this case, for example, the control unit 11 may display information notifying the user that the semiconductor device 1 is not deteriorated on the display device 12.

Next, the control unit 11 performs a deterioration determination step of determining that the semiconductor device 1 is deteriorated (step S21). Because at least one of the wiring potential difference calculated in step S11 and the bonding potential difference based on the graph generated in step S16 is equal to or more than its corresponding predetermined threshold, the control unit 11 determines that the semiconductor device 1 is deteriorated. In this case, it is assumed that a crack or peeling has occurred particularly in at least one of the wire bonding portions of the wiring wires 58a and the solder bonding portions of the bonding material 62 included in the semiconductor device 1. In this case, for example, the control unit 11 may give a warning by displaying information the user notifying that the semiconductor device 1 is deteriorated on the display device 12.

Next, the control unit 11 performs a life estimation step of estimating the remaining life period the of semiconductor device 1 (step S22). In this step, at least one of estimating the life period based on the wiring potential difference equal to or more than the threshold in step S17 and estimating the life period based on the bonding potential difference equal to or more than the threshold in step S18 is performed. The control unit 11 performs a least-squares method to calculate the slope of any one of the graphs generated in steps S15 and S16 in which the deterioration is determined, from a dataset of the number of power cycles corresponding to a measured potential difference equal to or more than the deterioration determination threshold. Along with the slope, based on the potential difference and the number of power cycles corresponding to the deterioration determination, the control unit 11 calculates the number of power cycles corresponding to when the threshold at which a malfunction occurs is reached.

First, a case in which the wiring potential difference is determined to be equal to or more than its threshold ("more") in step S17 (a case in which deterioration based on the wiring potential difference (the wire bonding portions) in step S15 is determined) will be described. That is, the estimation of the life period based on the wiring potential difference will be described.

For example, the control unit 11 acquires the wiring potential differences V1 and V2 with respect to the power cycle numbers C1 and C2. In addition, the control unit 11 acquires the power cycle number Ct at which the deterioration is determined and the wiring potential difference Vt corresponding thereto. The wiring potential difference Vt is equal to or more than the wiring potential difference Vw, which is the threshold at which deterioration occurs. The control unit 11 uses three points ((C1, V1), (C2, V2), (Ct, Vt)) acquired as described above and performs, for example, a least-squares method to calculate the slope.

From the slope calculated as described above, the control unit 11 acquires the power cycle number Cb corresponding to the wiring potential difference Vb, which is the threshold at which the semiconductor device 1 could malfunction. The control unit 11 calculates the difference between the power cycle number Cb and the power cycle number Ct and estimates the remaining life period after the determination of the deterioration of the semiconductor device 1.

Next, a case in which the bonding potential difference is determined to be equal to or more than its corresponding threshold ("more") in step S18 (a case in which deterioration based on the bonding potential difference (the solder bonding portions) in step S16 is determined) will be described. That is, the estimation of the life period based on the bonding potential difference will be described.

For example, the control unit 11 acquires the bonding potential differences V1 and V2 with respect to the power cycle numbers C1 and C2. In addition, the control unit 11 acquires the power cycle number Ct at which the deterioration is the determined and bonding potential difference Vt corresponding thereto. The bonding potential difference Vt is equal to or more than the bonding potential difference Vj, which is the threshold at which deterioration occurs. The control unit 11 uses three points ((C1, V1), (C2, V2), (Ct, Vt)) acquired as described above and performs, for example, a least-squares method to calculate the slope.

From the slope calculated as described above, the control unit 11 acquires the power cycle number Cb corresponding to the bonding potential difference Vb, which is the threshold at which the semiconductor device 1 could malfunction. The control unit 11 calculates the difference between the power cycle number Cb and the power cycle number Ct and estimates the remaining life period after the determination of the deterioration of the semiconductor device 1.

Next, a case which deterioration of the semiconductor device 1 is determined based on both of the wiring potential difference in step S15 and the bonding potential difference in step S16 will be described. In this case, as described above, both of the life period based on the wiring potential difference and the life period based on the bonding potential difference are estimated. In this case, the shorter one of the estimated life period based on the wiring potential difference and the estimated life period based on the bonding potential difference may be used as the estimated life period of the semiconductor device 1.

The control unit 11 may display at least one of the life period based on the wiring potential difference estimated in step S22 and the life period based on the bonding potential difference on the display device 12, along with the warning in step S21.

By performing the above deterioration determination method, the deterioration determination apparatus 10 is able to accurately determine deterioration of the semiconductor device 1. In addition, if the deterioration determination apparatus 10 determines that the semiconductor device 1 is deteriorated, the deterioration determination apparatus 10 is able to estimate the remaining life period of the semiconductor device 1.

The disclosed technique accurately determines deterioration of a semiconductor device and maintains the reliability of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a plurality of first semiconductor chips, each of which includes a first output electrode on a front surface thereof and a first input electrode on a rear surface thereof;
   a first input conductive plate on which the plurality of first semiconductor chips are arranged in a first direction and to which the first input electrodes of the plurality of first semiconductor chips are bonded;
   a first output conductive plate extending in the first direction and being provided adjacent to the first input conductive plate in a second direction orthogonal to the first direction;
   a case having first to fourth side walls, the first and third side walls each extending in the first direction, the second and fourth side walls each extending in the second direction, the case accommodating the first input conductive plate and the first output conductive plate;
   first main current wiring members, each of which connects one of the first output electrodes of the plurality of first semiconductor chips to a front surface of the first output conductive plate;
   a first detection terminal disposed in the first side wall, the first output conductive plate being disposed closer to the first side wall than is the first input conductive plate; and
   a first detection wiring member which connects the front surface of the first output conductive plate to the first detection terminal.

2. The semiconductor device according to claim 1, further comprising:
   a high potential terminal connected to the first input conductive plate; and
   an intermediate potential terminal electrically connected to the first output conductive plate at one of end portions thereof that oppose each other in the first direction, the one end portion being closer to the fourth side wall than is the other.

3. The semiconductor device according to claim 2, wherein
   the high potential terminal is connected to the first input conductive plate at one of two end portions thereof that oppose each other in the first direction, the one end portion being closer to the second side wall than is the other.

4. The semiconductor device according to claim 3, wherein the first detection terminal is disposed in an end portion of the first side wall that is closer to the second side wall than is the fourth side wall, and that faces an endmost first semiconductor chip that is closest to the second side wall among the plurality of first semiconductor chips, and
   wherein the first detection wiring member connects a portion of the first output conductive plate that faces the first detection terminal to the first detection terminal.

5. The semiconductor device according to claim 4, wherein a wiring angle of the first detection wiring member extending from the first output conductive plate to the first detection terminal with respect to the first direction is in a range of 70° to 110°.

6. The semiconductor device according to claim 5, wherein the wiring angle is in a range of 85° to 95°.

7. The semiconductor device according to claim 4, further comprising:
a second detection terminal disposed in the third side wall that is adjacent to the first input conductive plate, the first input conductive plate being closer to the third side wall than is the first output conductive plate; and
a second detection wiring member which connects the first output electrodes of the plurality of first semiconductor chips to the second detection terminal.

8. The semiconductor device according to claim 7, further comprising:
a first arm portion and a second arm portion which is adjacent to the first arm portion in the first direction and which is electrically connected to the first arm portion by a connection wiring member, the first and second arm portions being accommodated in the case,
wherein the first arm portion includes the plurality of first semiconductor chips, the first input conductive plate, the first output conductive plate, the first main current wiring members, the first detection terminal, the first detection wiring member, the second detection terminal, and the second detection wiring member, and
wherein the second arm portion includes
a plurality of second semiconductor chips, each of which includes a second output electrode on a front surface thereof and a second input electrode on a rear surface thereof,
a second input conductive plate on which the plurality of second semiconductor chips are arranged in the first direction and to which the second input electrodes of the plurality of second semiconductor chips are bonded, the second input conductive plate facing the first output conductive plate in the first direction, and having a portion electrically connected to the first output conductive plate by the connection wiring member,
a second output conductive plate extending in the first direction and facing the first input conductive plate, the second output conductive plate being adjacent to the second input conductive plate in the second direction, and closer to the third side wall than is the second input conductive plate,
second main current wiring members, each of which connects one of the second output electrodes of the plurality of second semiconductor chips to a front surface of the second output conductive plate,
a third detection terminal disposed in the third side wall, and
a third detection wiring member which connects the front surface of the second output conductive plate to the third detection terminal.

9. The semiconductor device according to claim 8,
wherein the intermediate potential terminal is connected to the second input conductive plate at one of two end portions thereof that oppose each other in the first direction, the one end portion being closer to the fourth side wall than is the other, and
wherein the semiconductor device further includes a low potential terminal connected to the second output conductive plate.

10. The semiconductor device according to claim 9,
wherein the third detection terminal is disposed in an end portion of the third side wall that is closer to the fourth side wall than to the second side wall, the end portion of the third side wall facing an endmost second semiconductor chip that is closest to the fourth side wall among the plurality of second semiconductor chips, and
wherein the third detection wiring member connects a portion of the second output conductive plate that faces the third detection terminal to the third detection terminal.

11. The semiconductor device according to claim 10, further comprising:
a fourth detection terminal disposed in the first side wall; and
a fourth detection wiring member which connects the second output electrodes of the plurality of second semiconductor chips to the fourth detection terminal.

12. A method for determining deterioration of the semiconductor device according to claim 1, the method comprising:
acquiring a first potential from the first detection terminal; and
determining deterioration of the semiconductor device based on the acquired first potential.

13. The method for determining deterioration of the semiconductor device according to claim 12,
wherein the high potential terminal of the semiconductor device is connected to the first input conductive plate at one of end portions thereof that oppose each other in the first direction, the one end portion being disposed closer to the second side wall than is the other,
wherein the first detection terminal of the semiconductor device is disposed in an end portion of the first side wall that is closer to the second side wall than is the fourth side wall, the end portion of the first side wall facing an endmost first semiconductor chip that is closest to the second side wall among the plurality of first semiconductor chips, and
wherein the first detection wiring member of the semiconductor device connects a portion of the first output conductive plate that faces the endmost first semiconductor chip to the first detection terminal.

14. The method for determining deterioration of the semiconductor device according to claim 13,
wherein the semiconductor device further includes
a second detection terminal disposed in the third side wall, and
a second detection wiring member which connects the first output electrodes of the plurality of first semiconductor chips to the second detection terminal,
wherein the acquiring of the first potential includes acquiring a second potential from the second detection terminal, and
wherein the determining of deterioration of the semiconductor device includes determining the deterioration of the semiconductor device based on a wiring potential difference, which is a difference between the first potential and the second potential.

15. The method for determining deterioration of the semiconductor device according to claim 14, wherein the determining of deterioration of the semiconductor device includes determining that the semiconductor device is deteriorated upon determining that the wiring potential difference is equal to or more than a predetermined first threshold.

16. The method for determining deterioration of the semiconductor device according to claim 15,
wherein the acquiring of the first potential further includes acquiring a high potential applied to the high potential terminal and an intermediate potential applied to the intermediate potential terminal, wherein the determining of deterioration of the semiconductor device further includes calculating an inter-main-terminal potential difference, which is a difference between the high potential and the intermediate potential, calculating a first bonding potential difference, which is a difference between the inter-main-terminal potential difference and the wiring potential difference, and determining that the semiconductor device is deteriorated upon determining that the wiring potential difference is equal to or more than the first threshold or that the first bonding potential difference is equal to or more than a predetermined second threshold.

17. The method for determining deterioration of the semiconductor device according to claim 16, the method further comprising predicting, after the determining of deterioration of the semiconductor device determines that the semiconductor device is deteriorated, a life period of the semiconductor device based on the first bonding potential difference and a second bonding potential difference acquired at a timing different from the timing at which the first bonding potential difference is acquired.

* * * * *